United States Patent [19]
Sawahata

[11] Patent Number: 5,737,250
[45] Date of Patent: Apr. 7, 1998

[54] METHOD AND SYSTEM FOR SIMULATING ION IMPLANTATION FOR PERFORMING SIMULATION WITH AVOIDING OVERFLOW BY ADJUSTING MEMORY CONSUMING AMOUNT

[75] Inventor: Koichi Sawahata, Tokyo, Japan

[73] Assignee: NEC Corporation, Tokyo, Japan

[21] Appl. No.: 541,265

[22] Filed: Oct. 12, 1995

[30] Foreign Application Priority Data

Oct. 14, 1994 [JP] Japan .................................. 6-249218

[51] Int. Cl.$^6$ .................................................. G06F 17/50
[52] U.S. Cl. .............. 364/578; 364/468.04; 364/468.28; 395/119; 395/138
[58] Field of Search ..................... 395/500, 119, 395/127, 125, 138, 523, 120; 364/578, 488, 468.04, 468.28, 468.26, 474.28; 434/62, 69

[56] References Cited

U.S. PATENT DOCUMENTS

| 5,379,225 | 1/1995 | Tazawa et al. ........................ 364/468 |
| 5,416,729 | 5/1995 | Leon et al. ............................ 364/578 |

OTHER PUBLICATIONS

Kitagawa et al., "An Interactive Voxel Data Manipulation System for Surgical Simulation", IEEE, 1994, pp. 204–209.

Westermann et al., "Reliable Solid Modeling for three Dimensional Semiconductor process and Device Simulation", IEEE, 1994, pp. 49–52.

"Analysis and Simulation of Semiconductor Devices"; Springer–Verlag, New York, pp. 46–63.

*Primary Examiner*—Kevin J. Teska
*Assistant Examiner*—Thai Phan
*Attorney, Agent, or Firm*—Whitham, Curtis & Whitham

[57] ABSTRACT

An ion implantation simulation system includes a grid generating portion for generating an orthogonal grid with respect to a two-dimensional configuration of a simulation object, an elongated segment extracting portion for extracting elongated segments defined by two grid lines in the orthogonal grid, a cell analyzing portion for extracting cells defined by adjacent grid lines perpendicular to the longer edge of the elongated segment, in the extracted elongated segments, and linearly rearranging polygon elements presenting in the cell along the longer edge direction, simulation performing portion performing linear ion implantation simulation with respect to the cell, in which the polygon elements are linearly rearranged, and a calculation result registering portion for registering an impurity concentration obtained as a result of simulation for each polygon element and registering the impurity concentration in each polygon element.

12 Claims, 20 Drawing Sheets

POLYHEDRON ELEMENT

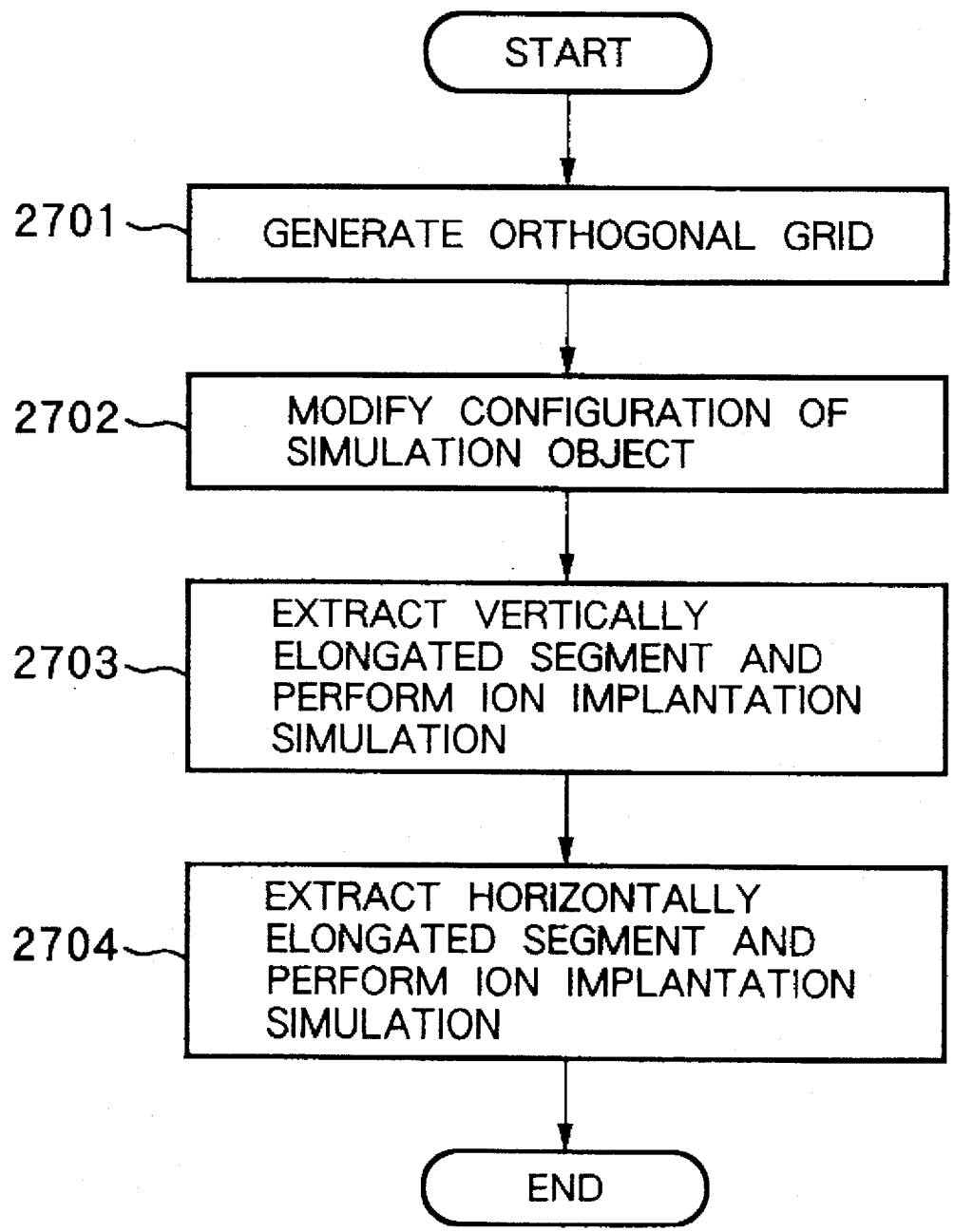

METHOD AND SYSTEM FOR SIMULATING ION IMPLANTATION FOR PERFORMING SIMULATION WITH AVOIDING OVERFLOW BY ADJUSTING MEMORY CONSUMING AMOUNT

BACKGROUND OF THE INVENTION

1. Field of the Invention

The present invention relates to a method and system for performing simulation of an ion implantation for numerically simulating ion implantation process in a fabrication process of a semiconductor device, by employing a computer. More specifically, the invention relates to a method and a system for performing simulation of ion implantation with avoiding overflow by adjusting memory consuming amount in a computer system.

2. Description of the Related Art

Simulation of fabrication process of semiconductor device has been performed employing numerical simulation technology by means of a computer. As the conventional simulation method employing an analyzing formulae with respect to two-dimensional structure has been disclosed in "Semiconductor Element Design Simulator" (Fuji Sogo Kenkyujo, published by Maruzen K. K.), P109. In the above-identified publication, the following method to perform two-dimensional structural analysis has been disclosed.

At first, simulation is performed with respect to one-dimensional structure to obtain impurity distribution $c(y)$ with respect to depth direction y. Then, two-dimensional impurity distribution $c(x, y)$ is obtained by re-distributing the one-dimensional distribution with Gaussian distribution. $c(x, y)$ is expressed by:

$$c(x,y) = \frac{1}{\sqrt{2\pi}\Delta x} \int_{-\infty}^{\infty} c(y)\exp\left(-\frac{(x-x')^2}{2\Delta x^2}\right) dx' \quad (1)$$

Here, $\Delta x$ represents a standard deviation expressing spreading impurity in the lateral direction.

If masks which block penetration of ions exist on the substrate except for the region of $X_L < X < X_R$, the equation (1) becomes:

$$c(x,y) = \frac{1}{2} c(y) \left\{ erfc\left(\frac{x-x_R}{\sqrt{2}\Delta x}\right) - erfc\left(\frac{x-x_L}{\sqrt{2}\Delta x}\right) \right\} \quad (2)$$

Here $erfc(t)$ is the complementary error function and is expressed by:

$$erfc(t) = \int_t^\infty \exp(-u^2) du \quad (3)$$

As a method of simulation of one-dimension ion implantation by the analytic models, there are technologys disclosed in "Analysis and Simulation of Semiconductor Devices" (Springer-Verlag Wien N.Y.). For simulating ion implantation profile, there are three kinds of distributions.

There are Gaussian distribution, two half Gaussian distributions and Pearson distribution employing $R_P$, $\Delta R_P$, $\beta$ and $\gamma$.

$R_P$(projected range) is the mean value of implanted ion profile, $\Delta R_P$ is the standard deviation of distribution of the implanted ion, $\gamma$ is a skewness indicative of distortion of distribution, and $\beta$ is a parameter called kurtosis which indicates degree of sharpness of the impurity concentration.

Gaussian distribution is expressed by employing $R_P$ and $\Delta R_P$:

$$I(R) = \frac{1}{\sqrt{2\pi}\Delta R_P} \exp\left[\frac{-(R-R_P)^2}{2\Delta R_P^2}\right] \quad (4)$$

The two half Gaussian distribution are expressed using $R_P$, $\Delta R_P$ and $\gamma$:

$$I(R) = \frac{\sqrt{2}}{\sqrt{\pi}(\sigma_1+\sigma_2)} \exp\left[\frac{-(R-R_m)^2}{2\sigma_1^2}\right] (R < R_m) \quad (5)$$

$$\frac{\sqrt{2}}{\sqrt{\pi}(\sigma_1+\sigma_2)} \exp\left[\frac{-(R-R_m)^2}{2\sigma_2^2}\right] (R \geq R_m)$$

$$R_P = R_m + \sqrt{\frac{2}{\pi}}(\sigma_2 - \sigma_1) \quad (6)$$

$$\Delta R_P^2 = \left(1 - \frac{2}{\pi}\right)(\sigma_2 - \sigma_1)^2 + \sigma_1\sigma_2 \quad (7)$$

$$\gamma\Delta R_P^2 = \sqrt{\frac{2}{\pi}}(\sigma_2-\sigma_1)\left[\left(\frac{4}{\pi}-1\right)(\sigma_2-\sigma_1)^2 + \sigma_1\sigma_2\right] \quad (8)$$

Pearson distribution is expressed with employing $\Delta R_P$, $\Delta R_P$, $\gamma$ and $\beta$:

$$\frac{dI(y)}{dy} = \frac{(y-a)I(y)}{b_0 + ay + b_2 y^2} \quad (9)$$

$$y = R - R_P \quad (10)$$

$$a = \frac{-\Delta R_P \gamma(\beta+3)}{A} \quad (11)$$

$$b_0 = \frac{-\Delta R_P^2(4\beta - 3\gamma^2)}{A} \quad (12)$$

$$b_2 = \frac{-2\beta + 3\gamma^2 + 6}{A} \quad (13)$$

$$A = 10\beta - 12\gamma^2 - 18 \quad (14)$$

"Analysis and Simulation of Semiconductor Device" (Springer-Verlag Wien N.Y.) discloses simulation method with analytic equation with respect to two layer structure. Discussion will be given hereinafter with respect to application for multi-layer structure.

For each layer of a substrate, materials are defined, and moments with respect to each materials are preliminarily given. Therefore, with these moments of each layer, the distribution $I(u)$ is determined. However, except for the uppermost layer, the distribution at each layer is not the same distribution as $I(u)$.

In case of the ion implantation simulation for the multi-layer structure, with taking the uppermost layer as the first layer, the impurity distribution of the (k)th layer may be defined by:

$$I(u - u_l + u_s) \quad (15)$$

$$u_l = \sum_{1}^{k-1} t_i \quad (16)$$

$$u_s = \sum_{1}^{k-1} \frac{t_i R_P}{R_{Pi}} \quad (17)$$

Here, $t_i$ is a thickness of the (i)th layer, and $R_{Pi}$ is a moment at the (i)th layer. On the other hand, $R_P$ is a moment of the layer ((k)th layer) currently is being calculated.

On the other hand, the distribution of the equation 15 given for each layer is standardized to be 1 when it is integrated in an infinite range. After determining $I(u-u_l+u_s)$, the coefficient of distribution of each layer is given in the following manner.

Assuming that the coefficient is α, α is determined so that an integrated value of the impurity amount up to the layers immediately before (k)th layer and impurity distribution function of the (k)th layer $\alpha l(u-u_l+u_s)$ in a range from $u=u_l$ to $u=\infty$ becomes equal to a dose amount.

Next, in order to define the impurity distribution on the substrate, a mesh is established. According to the above-mentioned "Semiconductor Element Design Simulator" (Fuji Sogo Kenkyujo, published by Maruzen K. K.), P104, the impurity distribution may be defined as difference mesh. FIG. 23 is an illustration showing a difference mesh and positions of physical amount defined on the difference mesh. a1 and a2 of FIG. 23 are widths in x direction of difference mesh, b1 and b2 are widths in y direction of the difference mesh, h1 and h2 are distance between center points of the difference meshes in x direction, k1 and k2 are distance between the center points of the difference meshes. Definition of the physical amount is made in such a manner that a scaler amount is defined by the center of the difference mesh and a vector amount is defined by a boundary of the difference mesh. On the other hand, as shown in FIG. 24, the physical boundary becomes in stepwise configuration by approximating with the boundary of the orthogonal grid.

However, when discrete process is performed in this method, the substance having smaller size in comparison with the grid may be ignored. In order to generate a grid with reflecting the result of analysis without ignoring the configuration of the substance having small size, it becomes necessary to establish a grid on nodal points of lines of the boundary lines of the substance defines by a string of lines.

A method of performing simulation of ion implantation of the two-dimensional structure according to such requirement will be discussed with reference to the drawing. FIG. 25A is an illustration showing a manner defining the boundaries of substance by the string of lines. With respect to the substance boundary line, the orthogonal mesh is established with respecting the nodal points (configuration characteristic points) of the lines as shown in FIG. 25b, and the intersection of the grids and the configuration lines passing the intersection are converted into stepwise configuration along the orthogonal grid.

Next, as shown in FIG. 25C, a vertically elongated segment defined by the grid is taken to perform linear simulation of ion implantation in the multi-layer structure by the analyzing formulae. Then, in respective rectangular areas in the vertically elongated segment, amounts of impurity in the cells defined by the vertical grid are calculated. After performing linear simulation of ion implantation for all of the vertically extending segments, for redistribution of the impurity distribution in the lateral direction, the laterally elongated segments is taken as shown in FIG. 25C. With respect to each extracted laterally elongated segments, the dose amount of the impurity has already been defined as shown in FIG. 26A, the spread in the lateral direction of the impurity is calculated by applying the foregoing equation 2. When the impurity between x3 and x4 shown in FIG. 26A is to be re-distributed, $$c(x,y) = \frac{1}{2} c(y) \left\{ erfc\left(\frac{x-x4}{\sqrt{2}\Delta x}\right) - erfc\left(\frac{x-x3}{\sqrt{2}\Delta x}\right) \right\} \quad (18)$$

Thus, re-distribution is performed by obtaining the distribution as illustrated in FIG. 26B.

FIG. 27 is a flowchart showing a process of operation of the conventional ion implantation simulation method.

At first, with respect to the substrate, an orthogonal grid overlapping the orthogonal grid points on the configuration characteristic points is generated (step 2701). Then, the configuration is converted into a stepwise configuration so that the stepwise configuration may overlap with the orthogonal grid (step 2702). Next, the vertically elongated segment defined by the orthogonal grid is taken. With respect to the vertically elongated segment extracted, ion implantation simulation in the multi-layer structure is performed (step 2703). This step is performed with respect to all of the vertically extending elements defined by the orthogonal grid. Next, the horizontally or laterally elongated segments are taken. With respect to the extracted laterally elongated segments, re-distribution of the impurity in the later is performed (step 2704). Redistribution in the lateral direction is performed with respect to all of the vertically elongated segments defined by the orthogonal grid.

The conventional simulation method for ion implantation can be not always applicable depending upon the configuration of the semiconductor elements to be the objects of simulation.

A manner of application of the conventional ion implantation simulation to LOCOS configuration, is illustrated in FIGS. 28A and 28B. FIG. 28A shows the configuration of LOCOS. In FIG. 28A, white circle represents configuration characteristic points. FIG. 28B shows the condition where the grid is established with respect to the configuration characteristic points with respect to the shown configuration similarly to the case illustrated in FIG. 25B. As a result of establishment of the grid with respect to the configuration characteristic points, the grid may intersects with the configuration line other than the configuration characteristic points. In FIG. 28C, the points where the grid line in longitudinal direction intersecting with the configuration lines but are not the configuration characteristic points, are indicated by "x" marks. Also, points where the grid line in transverse direction intersecting with the configuration lines but are not the configuration characteristic points, are indicated by "triangular" marks. Here, in order to form the stepwise configuration shown in FIG. 28C, the points indicated by the x marks and triangular marks have to be made as intersecting points of the grid lines. Therefore, as shown in FIG. 28D, new transverse or longitudinal grid lines are generated to pass the points on the configuration lines where only one of the longitudinal or transverse existing grip lines intersect. The newly generated grid lines intersects to the configuration lines at points other than the triangular marks and the x marks. Accordingly, for the newly established intersecting points, further grid lines have to be generated. Therefore, in case of the configuration where the grid lines intersect a plurality of configuration lines, the number of grid lines should be increased infinitely, in the shown algorithm.

On the other hand, since the impurity concentration is defined on the cells formed by the grids, an array having a capacity to store the impurity distribution of respective cells on the computer. However, since a capacity of the memory to be mounted on the computer is limited, the capacity to be provided for the array for storing the impurity distribution is naturally limited.

Accordingly, when the number of cells exceeds the upper limit of the capacity of the array, it becomes impossible to define impurity distribution with respect to all intersections. Thus, judgement for overflow will be made to make simulation process impossible. For example, when the array is provided a capacity of 10,000 points of cells, and when the number of the longitudinal grid lines is 100, if the number of the transverse grid line becomes greater than or equal to 100, overflow is caused to make simulation impossible.

In the simulation of the fabrication process of the semiconductor, there is a process, such as LOCOS oxidation, in which the configuration is varied into complicated configuration. After the configuration of the substrate becomes complicate, ion implantation is frequently performed. In FIG. 29, one example of the LOCOS configuration actually produced through simulation is shown. When ion implantation is to be performed for the shown configuration, in the conventional ion implantation simulating method, overflow is inherently caused in the grid in the reason set forth above. Therefore, by the conventional simulation method, simulation of ion implantation for the complicated configuration cannot be performed.

SUMMARY OF THE INVENTION

In view of the problems set forth above, it is an object of the present invention to provide a ion implantation simulation method which can avoid overflow of memory to make simulation impossible even when ion implantation simulation is performed with respect to a configuration, in which grid lines intersects a plurality of boundary lines of substances.

According to one aspect of the invention, an ion implantation simulation system comprises:

grid generating means for generating an orthogonal grid with respect to a two-dimensional configuration of a simulation object;

elongated segment extracting means for extracting elongated segments defined by two grid lines in the orthogonal grid;

cell analyzing means for extracting cells defined by adjacent grid lines perpendicular to the longer edge of the elongated segment, in the extracted elongated segments, and linearly rearranging polygon elements presenting in the cell along the longer edge direction;

simulation means performing linear ion implantation simulation with respect to the cell, in which the polygon elements are linearly rearranged; and calculation result registering means for registering an impurity concentration obtained as a result of simulation for each polygon element and registering the impurity concentration in each polygon element.

In the preferred construction, the cell analyzing means may calculate areas and gravity center positions of polygon elements in the extracted cell and convert respective polygon elements into rectangular elements having the same areas to corresponding polygon elements and having uniform length in the width direction, and rearrange the rectangular elements depending upon calculated gravity center position along the longer edge direction. The elongated segment extracting means may extract all of elongated segments in orthogonal two directions formed by the orthogonal grid, and the cell analyzing means may rearrange the polygon elements with respect to each cell along longer edge direction with respect to the elongated segment extracted in two directions. The cell analyzing means may calculate areas and gravity center positions of polygon elements in the extracted cell and convert respective polygon elements into rectangular elements having the same areas to corresponding polygon elements and having uniform length in the width direction, and rearrange the rectangular elements depending upon calculated gravity center position along the longer edge direction.

According to another aspect of the invention, an ion implantation simulation system comprises:

grid generating means for generating an arbitrary orthogonal three-dimensional grid with respect to a three-dimensional configuration of a simulation object;

rectangular parallelopiped block extracting means for extracting rectangular parallelopiped blocks defined by two orthogonally arranged sets of mutually parallel two planes;

cell analyzing means for extracting three-dimensional cells defined by adjacent grid planes perpendicular to the longer edge of the elongated segment, in the extracted rectangular parallelopiped blocks, and linearly rearranging polyhedral elements presenting in the three-dimensional cell along the longer edge direction;

simulation means performing linear ion implantation simulation with respect to the three-dimensional cell, in which the polyhedron elements are linearly rearranged; and calculation result registering means for registering an impurity concentration obtained as a result of simulation for each polyhedron element and registering the impurity concentration in each polyhedron element.

In the preferred construction, the cell analyzing means may calculate volumes and gravity center positions of polyhedron elements in the extracted three-dimensional cell and convert respective polyhedron elements into rectangular parallelopiped elements having the same volumes to corresponding polyhedron elements and having uniform length in the width direction, and rearrange the rectangular parallelopiped elements depending upon calculated gravity center position along the longer edge direction. The rectangular parallelopiped block extracting means may extract all of rectangular parallelopiped block in the three-dimensional grids, and the cell analyzing means may rearrange the polyhedron elements with respect to each cell along longer edge direction with respect to the rectangular parallelopiped blocks extracted in three directions. The cell analyzing means may calculate the volumes and gravity center positions of the polyhedron elements in one three-dimensional cell included in mutually perpendicularly extending three rectangular parallelopiped blocks with respect to one of the three rectangular parallelopiped blocks, and calculate only gravity center positions upon rearranging the polyhedron elements within the three-dimensional cell with respect to the other rectangular parallelopiped blocks with using areas calculated upon rearranging the polyhedron segments with respect to the one of the rectangular parallelopiped blocks.

According to a further aspect of the invention, an ion implantation simulation method comprises:

a step of generating an orthogonal grid with respect to a two-dimensional configuration of a simulation object;

a step of extracting elongated segments defined by two grid lines in the orthogonal grid;

a step of extracting cells defined by adjacent grid lines perpendicular to the longer edge of the elongated segment, in the extracted elongated segments, and linearly rearranging polygon elements presenting in the cell along the longer edge direction;

a step of performing linear ion implantation simulation with respect to the cell, in which the polygon elements are linearly rearranged; and a step of registering an impurity concentration obtained as a result of simulation for each polygon element and registering the impurity concentration in each polygon element.

The cell analyzing step may comprise a step of calculating areas and gravity center positions of polygon elements in the extracted cell;

a step of converting respective polygon elements into rectangular elements having the same areas to corresponding polygon elements and having uniform length in the width direction, and a step of rearranging the rectangular elements depending upon calculated gravity center position along the longer edge direction.

According to a still further aspect of the invention, an ion implantation simulation method comprises:

a step of generating an orthogonal grid with respect to a two-dimensional configuration of a simulation object;

a step of extracting elongated segments defined by two grid lines in the orthogonal grid and extending a predetermined one direction in the orthogonal grid;

a step of extracting cells defined by adjacent grid lines perpendicular to the longer edge of the elongated segment, in the extracted elongated segments, and linearly rearranging polygon elements presenting in the cell along the longer edge direction;

a step of performing linear ion implantation simulation with respect to the cell, in which the polygon elements are linearly rearranged;

a step of registering an impurity concentration obtained as a result of simulation for each polygon element and registering the impurity concentration in each polygon element;

a step of extracting elongated segments defined by two grid lines in the orthogonal grid and extending a predetermined the other direction in the orthogonal grid;

a step of extracting cells defined by adjacent grid lines perpendicular to the longer edge of the elongated segment, in the extracted elongated segments, and linearly rearranging polygon elements presenting in the cell along the longer edge direction; and a step of registering an impurity concentration obtained as a result of simulation for each polygon element and registering the impurity concentration in each polygon element.

The two steps for rearranging the polygon elements within the cell may include:

a step of calculating areas and gravity center positions of polygon elements in the extracted cell; and a step of rearranging the polygon elements along the longer edge of the elongated segment depending upon the calculated gravity center positions.

The step of rearranging the polygon elements within the cell corresponding to the elongated segment defined by grid lines extending in predetermined one direction may comprise:

a step of calculating areas and gravity center positions of the polygon elements within the extracted cell;

a step of converting the polygon elements into a rectangular elements having the same areas to the corresponding polygon elements and uniform length in the width direction; and a step of rearranging the rectangular elements along the longer edge direction of the elongated segment depending upon the gravity center positions, and the step of rearranging the polygon elements within the cell corresponding to the elongated segment defined by grid lines extending in predetermined the other direction comparing:

a step of calculating the gravity center positions of the polygon elements within the extracted cell;

a step of converting the polygon elements into a rectangular elements having the same areas to areas calculated in the step of rearranging the polygon elements in the cell corresponding to the elongated segment defined by the grid line extending in the one direction, and having uniform length in the width direction; and a step of rearranging the rectangular elements along the longer edge direction of the elongated segment depending upon the gravity center positions.

According to a yet further aspect of the invention, an ion implantation simulation method comprises:

a step of generating an arbitrary orthogonal three-dimensional grid with respect to a three-dimensional configuration of a simulation object;

a step of extracting rectangular parallelopiped blocks defined by two orthogonally arranged sets of mutually parallel two planes;

a step of for extracting three-dimensional cells defined by adjacent grid planes perpendicular to the longer edge of the elongated segment, in the extracted rectangular parallelopiped blocks, and linearly rearranging polyhedral elements presenting in the three-dimensional cell along the longer edge direction;

a step of performing linear ion implantation simulation with respect to the three-dimensional cell, in which the polyhedron elements are linearly rearranged; and a step of registering an impurity concentration obtained as a result of simulation for each polyhedron element and registering the impurity concentration in each polyhedron element.

the step of rearranging the polyhedron elements within the cell may comprise:

a step of calculating volumes and gravity center positions of the polyhedron elements within the extracted three-dimensional cell;

a step of converting the polyhedron elements into rectangular parallelopiped elements having the equal volume to the corresponding polyhedron elements and having a plane equal to the plane perpendicular to the longitudinal direction of the rectangular parallelopiped block; and a step of rearranging the rectangular parallelopiped elements along the longitudinal direction of the rectangular parallelopiped block depending upon the gravity center positions.

According to a still further aspect of the invention, an ion implantation simulation method comprises:

a step of generating an arbitrary orthogonal three-dimensional grid with respect to a three-dimensional configuration of a simulation object;

a step of extracting rectangular parallelopiped blocks defined by two orthogonally arranged sets of mutually parallel two planes, in which four planes extending in predetermined one direction;

a step of for extracting three-dimensional cells defined by adjacent grid planes perpendicular to the longer edge of the elongated segment, in the extracted rectangular parallelopiped blocks, and linearly rearranging polyhedral elements presenting in the three-dimensional cell along the longer edge direction;

a step of performing linear ion implantation simulation with respect to the three-dimensional cell, in which the polyhedron elements are linearly rearranged; and a step of registering an impurity concentration obtained as a result of simulation for each polyhedron element and registering the impurity concentration in each polyhedron element.

a step of extracting rectangular parallelopiped blocks defined by two orthogonally arranged sets of mutually parallel two planes, in which four planes extending in predetermined another direction;

a step of for extracting three-dimensional cells defined by adjacent grid planes perpendicular to the longer edge of the elongated segment, in the extracted rectangular parallelopiped blocks, and linearly rearranging polyhedral elements presenting in the three-dimensional cell along the longer edge direction;

a step of registering an impurity concentration obtained as a result of simulation for each polyhedron element and registering the impurity concentration in each polyhedron element derived by performing linear ion implantation simulation with respect to the three-dimensional cell, in which the polyhedron elements are linearly rearranged with respect to the rectangular parallelopiped block defined by the four planes extending in the one direction;

a step of extracting rectangular parallelopiped blocks defined by two orthogonally arranged sets of mutually parallel two planes, in which four planes extending in predetermined the other direction perpendicular to the one direction and to the another direction;

a step of for extracting three-dimensional cells defined by adjacent grid planes perpendicular to the longer edge of the elongated segment, in the extracted rectangular parallelopiped blocks, and linearly rearranging polyhedral elements presenting in the three-dimensional cell along the longer edge direction;

a step of registering an impurity concentration obtained as a result of simulation for each polyhedron element and registering the impurity concentration in each polyhedron element derived by performing linear ion implantation simulation with respect to the three-dimensional cell, in which the polyhedron elements are linearly rearranged with respect to the rectangular parallelopiped block defined by the four planes extending in the one direction.

The three steps of rearranging the polyhedron elements within the cell may comprise:

a step of calculating volumes and gravity center positions of the polyhedron elements in the extracted three-dimensional cell;

a step of converting the polyhedron elements into rectangular parallelopiped elements having the equal volume to the corresponding polyhedron elements and having a plane equal to the plane perpendicular to the longitudinal direction of the rectangular parallelopiped block; and a step of rearranging the rectangular parallelopiped elements along the longitudinal direction of the rectangular parallelopiped block depending upon the gravity center positions.

Also, the step of rearranging polyhedron elements within the three-dimensional cell corresponding to the rectangular parallelopiped block defined by four grid planes extending in the predetermined one direction may comprise:

a step of calculating volumes and gravity center positions of the polyhedron elements in the extracted three-dimensional cell;

a step of converting the polyhedron elements into rectangular parallelopiped elements having the equal volume to the corresponding polyhedron elements and having a plane equal to the plane perpendicular to the longitudinal direction of the rectangular parallelopiped block; and a step of rearranging the rectangular parallelopiped elements along the longitudinal direction of the rectangular parallelopiped block depending upon the gravity center positions, and the two steps of rearranging polyhedron elements within the three-dimensional cell corresponding to the rectangular parallelopiped block defined by four grid planes extending in the predetermined the other direction perpendicular to the one direction comprises:

a step of calculating gravity center positions of the polyhedron elements in the extracted three-dimensional cell;

a step of converting the polyhedron elements into rectangular parallelopiped elements having the equal volume to the volume of the polyhedrons calculated in the step of rearranging the polyhedrons within the three-dimensional cell corresponding to the rectangular parallelopiped block defined by four grid planes extending in the one direction, and having a plane equal to the plane perpendicular to the longitudinal direction of the rectangular parallelopiped block; and a step of rearranging the rectangular parallelopiped elements along the longitudinal direction of the rectangular parallelopiped block depending upon the gravity center positions.

Other objects, features and effects of the present invention will become apparent from the detailed description given hereinafter.

BRIEF DESCRIPTION OF THE DRAWINGS

The present invention will be understood more fully from the detailed description given herebelow and from the accompanying drawings of the preferred embodiment of the invention, which, however, should not be taken to be limitative to the present invention, but are for explanation and understanding only.

In the drawings:

FIG. 27 is an illustration showing the conventional ion implantation system;

DESCRIPTION OF THE PREFERRED EMBODIMENT

The preferred embodiments of the present invention will be discussed hereinafter in detail with reference to the accompanying drawings. In the following description, numerous specific details are set forth in order to provide a thorough understanding of the present invention. It will be obvious, however, to those skilled in the art that the present invention may be practiced without these specific details. In other instance, well-known structures are not shown in detail in order to unnecessary obscure the present invention.

Figure 1:
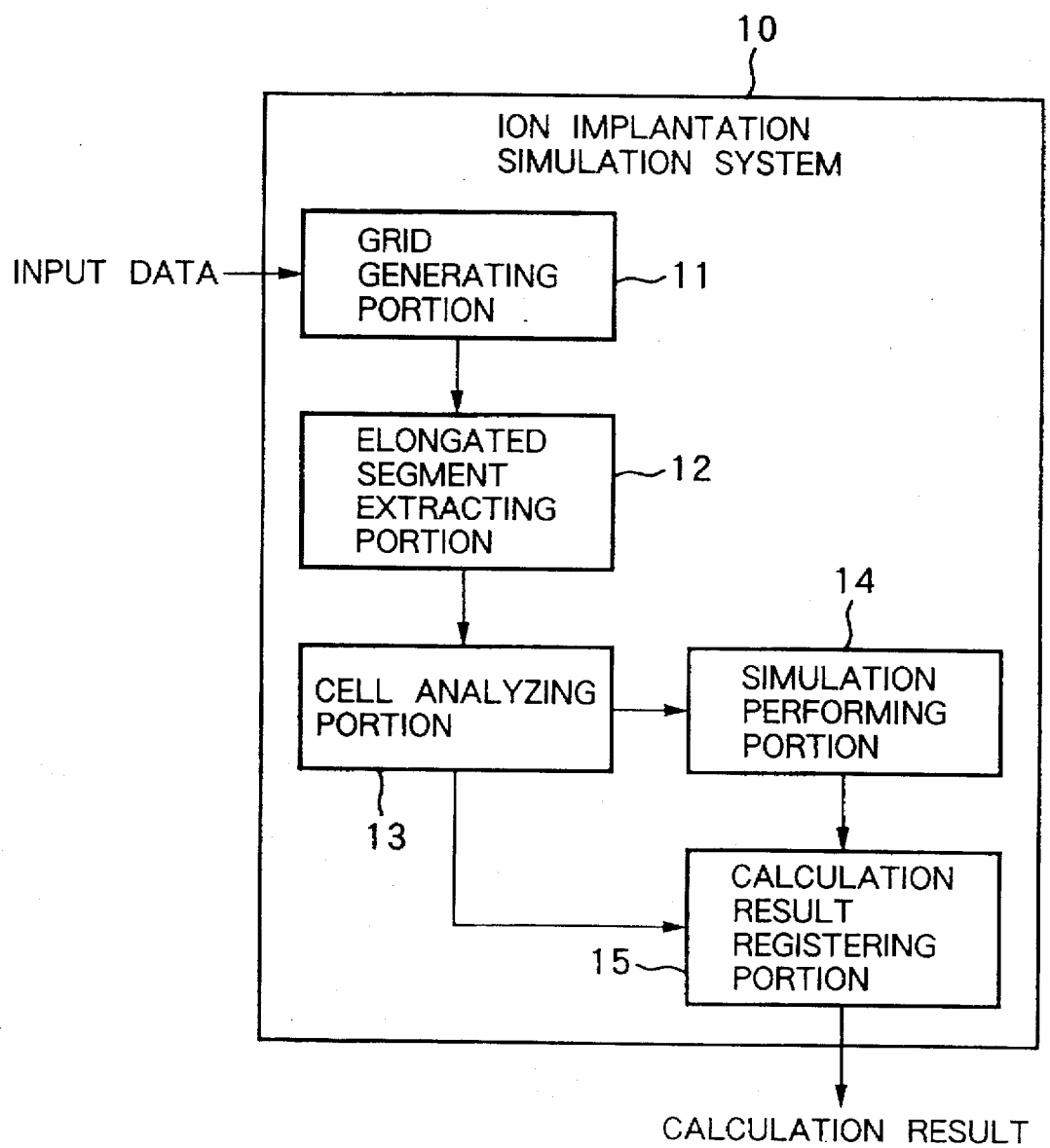
FIG. 1 is a functional block diagram showing a construction of the first embodiment of an ion implantation simulation system according to the present invention.

FIG. 1 is a functional block diagram showing a construction of the first embodiment of an ion implantation simulation system for implementing the first embodiment of an ion implantation simulating method according to the invention.

As shown, the shown embodiment of an ion implantation simulation system 10 includes a grid generating portion 11 for generating an orthogonal grid on a sectional configuration of a semiconductor substrate as an object for simulation, an elongated segment extracting portion 12 for extracting a column like portion (hereinafter referred to as elongated segment) defined by the orthogonal grid, a cell analyzing portion 13 for extracting each cell defined by grid lines transverse to the longer edge direction of the extracted elongated segment and deriving an area and gravity center of a polygon presenting in the cell, a simulation executing portion 14 for performing linear ion implantation simulation with respect to the result of analysis by the cell analyzing portion 13, a calculation result registering portion 15 for registering the results of simulation performed by the simulation executing portion 14 in the original polygon of the cell. It should be noted that, in FIG. 1, only characteristic construction of the shown embodiment has been illustrated and other construction which are less relevant to the subject matter of the present invention has been neglected. While not disclosed, in practice, in addition to the foregoing components, an output means for displaying the sectional configuration of the semiconductor substrate as the simulation object and process of simulation, a storage means for storing various data and so forth are provided in the simulation system in per se known manner.

The grid generating portion 11 is realized by a program controlled CPU and so forth and generates the orthogonal grid on the sectional configuration of the semiconductor substrate as the simulation object. The orthogonal grid is generated in completely arbitrary fashion irrespective of the sectional configuration of the semiconductor substrate. Accordingly, adapting to the capacity of a memory (not shown) provided in the simulation system 10, the grid is generated so as not to cause overflow.

The elongated segment extracting portion 12 is also realized by the program controlled CPU and so forth. The elongated segment extracting portion 12 extracts longitudinally elongated segments extending in longitudinal direction defined by respectively adjacent two straight grid lines extending in the longitudinal direction in the orthogonal grid and transversely elongated segments extending in transverse direction defined by respectively adjacent two grid lines extending in transverse direction the orthogonal grid.

The cell analyzing portion 13 is also realized by the program controlled CPU and so forth and derives the areas and gravity centers of polygons presenting in each cell with extracting cells from the elongated segment. Then, the cell analyzing portion 13 converts the polygons into rectangles having areas equal to the areas of the polygons, and arrange the converted rectangles in order with respect to the gravity center positions.

The simulation executing portion 14 is realized by the program controlled CPU and so forth and performs linear ion implantation simulation with respect to the elongated segment, in which the cells containing the rectangles converted and arranged in order in the cell analyzing portion 13 are present. The linear ion implantation simulation to be performed by the simulation executing portion 14 is similar to that performed in the prior art. In concrete, the simulation is performed utilizing the foregoing equation 4.

The calculation result registering portion 15 is also realized by the program controlled CPU and so forth. The calculation result registering portion 15 registers the result of simulation to the original polygon in the cell with respect to each rectangle. By this, in each cell, the result of simulation with respect to each polygon is stored.

Figure 2:
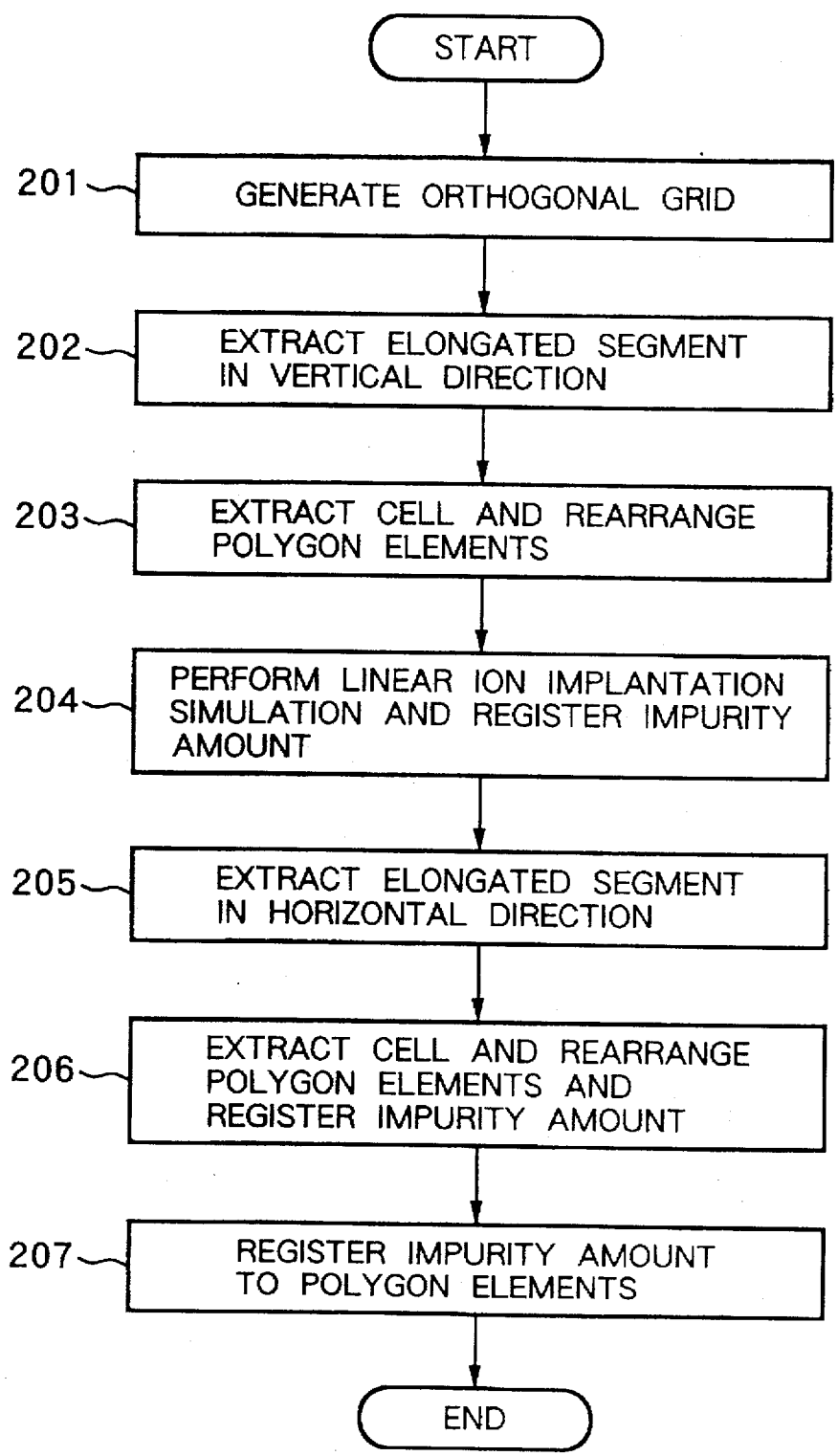
FIG. 2 is a flowchart showing operation of the first embodiment of the ion implantation simulating method according to the invention.

Next, operation in the shown embodiment of the simulation method will be discussed with reference to the flowchart in FIG. 2. It should be noted that FIG. 3 is an illustration showing a sectional configuration of the semiconductor substrate as the simulation object, and FIGS. 4 to 10 are illustrations for explaining the process steps of ion implantation simulation performed according to the steps illustrated in FIG. 2.

Figure 3:
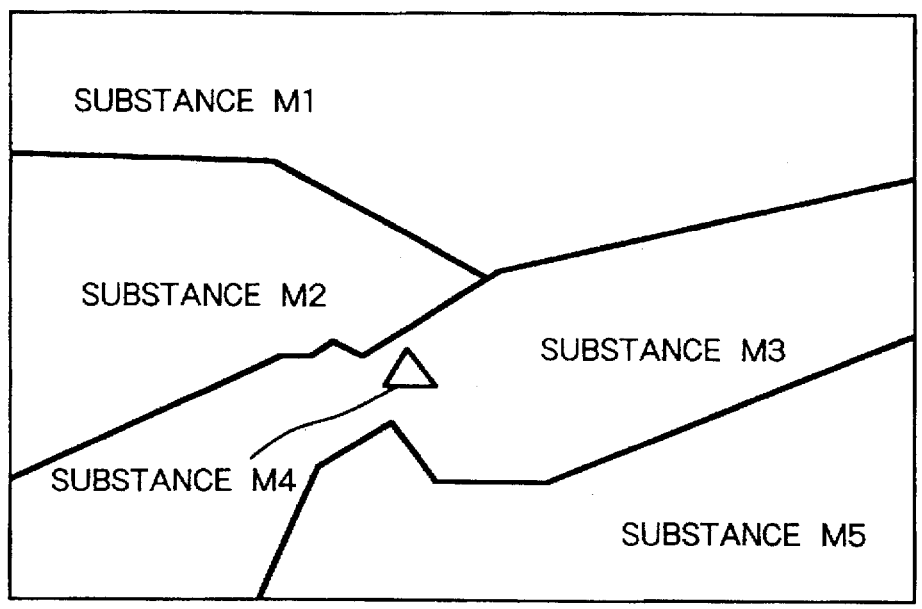
FIG. 3 is an illustration showing an intermediate step in simulation performed by the first embodiment of the ion implantation simulating method.

As shown in FIG. 3, the semiconductor substrate to be an object for process of ion implantation simulation in the shown embodiment is assumed to be constructed with substances M1 to M5. At first, the grid generating portion 11 generates the orthogonal grid consisted of horizontal straight lines x1, x2, ~, xi, xi+1, ~, xn and vertical straight lines y1, y2, ~, yi, yi+1, ~, yn, irrespective of the two-dimensional configuration of the substrate shown in FIG. 3, as shown in FIG. 4 (step 201).

Figure 4:
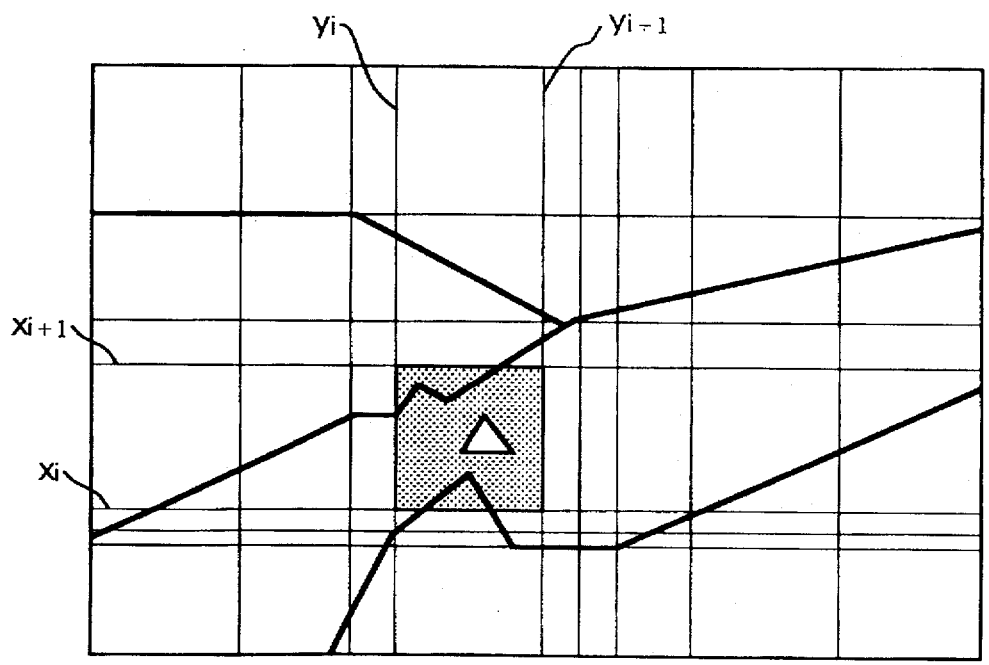
FIG. 4 is an illustration showing an intermediate step in simulation performed by the first embodiment of the ion implantation simulating method.
Figure 5:
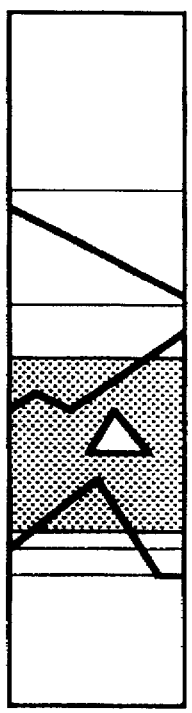
FIG. 5 is an illustration showing an intermediate step in simulation performed by the first embodiment of the ion implantation simulating method.

Next, as shown in FIG. 4, from the substrate configuration divided by the orthogonal grid, the elongated segment extracting portion 12 extracts elongated segments defined by respectively adjacent two vertical strain lines (step 202). As an example, the elongated segment defined between the straight lines yi and yi+1 is shown in FIG. 5.

Figure 6:
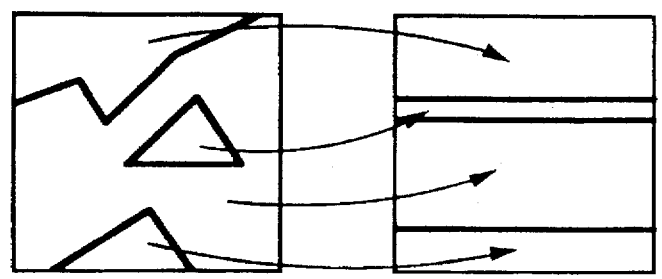
FIG. 6 is an illustration showing an intermediate step in simulation performed by the first embodiment of the ion implantation simulating method.
Figure 7:
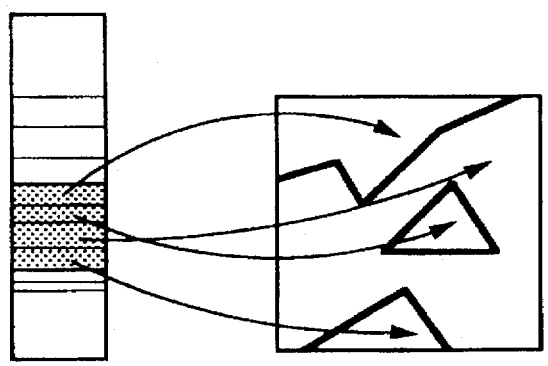
FIG. 7 is an illustration showing an intermediate step in simulation performed by the first embodiment of the ion implantation simulating method.

From each of the extracted vertically elongated cells, the cell analyzing portion 13 extracts cells defined between respective pairs of adjacent horizontal straight lines. In the elongated segment illustrated in FIG. 5, a cell defined between the horizontal straight lines xi and xi+1 is illustrated in FIG. 6. The following discussion will be concentrated to the discussion for the cell in FIG. 6 for simplification of disclosure. The cell analyzing portion 13 divides the inside of the extracted cell into polygons by the boundary of substances presenting in the cell and calculates areas and gravity centers of respective polygons in the cell. Then, each polygon is converted into rectangles elongated in the horizontal direction in the cell and having the equal areas to the original polygons. In order to make the structure of the cells containing polygons applicable for linear ion implantation simulation, the converted rectangles are stacked in order of the height of the gravity centers of the corresponding polygons as shown in FIG. 5 (step 203).

Next, with respect to the vertically elongated segment converted into a multi-layer structure of a plurality of stacked rectangles by the cell analyzing portion 13, the simulation performing portion 14 performs the linear ion implantation simulation to derive amount of impurity contained in each rectangle in the cell. Subsequently, the calculation result registering portion 15 registers the calculated amount of impurity in each rectangle with correlation to the corresponding polygon (step 204).

Figure 8:
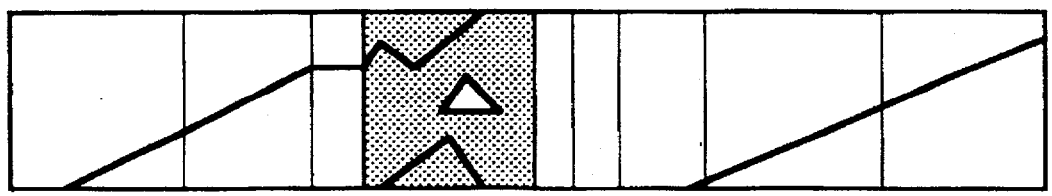
FIG. 8 is an illustration showing an intermediate step in simulation performed by the first embodiment of the ion implantation simulating method.

Thereafter, the elongated segment extracting portion 12 extracts the horizontally elongated segments defined by respective adjacent horizontal straight lines in the orthogonal grid (step 205). As an example, the elongated segment defined by the horizontal straight lines xi and xi+1 is shown in FIG. 8.

Figure 9:
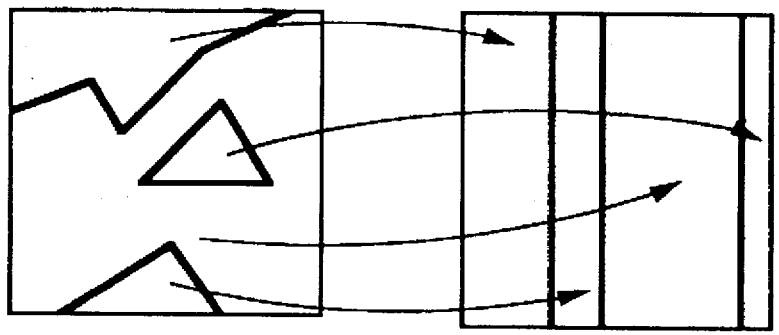
FIG. 9 is an illustration showing an intermediate step in simulation performed by the first embodiment of the ion implantation simulating method.

From the extracted horizontally elongated segment, the cell analyzing portion 13 extracts each cell defined by adjacent vertical straight lines. In the elongated segment illustrated in FIG. 8, the cell defined between the vertical lines yi and yi+1 is illustrated in FIG. 9, for example. The cell analyzing portion 13 divides the inside of the extracted cell into polygons by the boundary of substances presenting in the cell and calculates areas and gravity centers of respective polygons in the cell. Then, each polygon is converted into rectangles elongated in the vertical direction in the cell and having the equal areas to the original polygons. In order to make the structure of the cells containing polygons applicable for linear ion implantation simulation, the converted rectangles are stacked in order of the horizontal positions of the gravity centers of the corresponding polygons as shown in FIG. 9. Then, with respect to the stacked rectangles, the impurity amount registered at the step 204 is registered in the corresponding rectangles (step 206).

Figure 10:
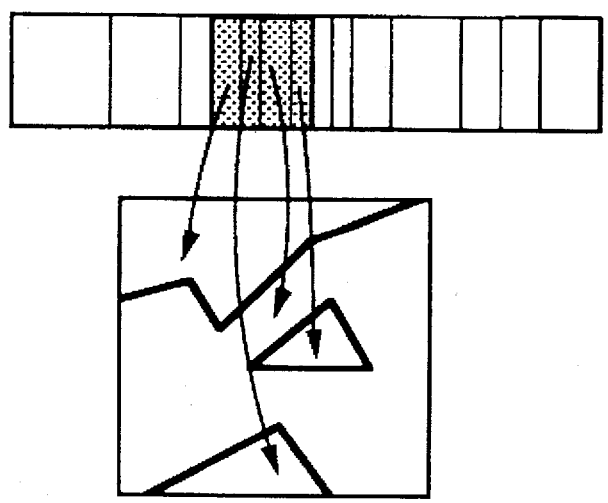
FIG. 10 is an illustration showing an intermediate step in simulation performed by the first embodiment of the ion implantation simulating method.

Next, the calculation result registering portion 15 performs re-distribution of impurity distribution of the horizontally extending segments converted into the linear structure with respect to each rectangle. The impurity amount to be contained in each rectangles as a result of re-distribution is registered in the original polygon corresponding to each rectangle as shown by FIG. 10, by the calculation result registering portion 15 (step 207).

Here, by extending the prior art, in the cell defined by the straight lines xi and xi+1 and straight lines yi and yi+1 in FIG. 3, the substance M3 has the largest polygon having the biggest area. Therefore, it may be easily thought of that the conversion is performed with regarding that the overall cell in question is formed of the substance M3. However, in the shown embodiment, by converting respective polygons into rectangles to perform simulation, even substance having small area is not ignored. Therefore, higher accuracy in simulation can be achieved.

It should be noted that, in the foregoing step 206 in the shown embodiment, it is clear that the areas of the polygons calculated in the step 203 may be used instead of calculating the areas of respective polygons. By taking this way, redundant calculation of the areas of the polygons can be avoided to contribute for improvement of throughput in simulation process.

Figure 11:
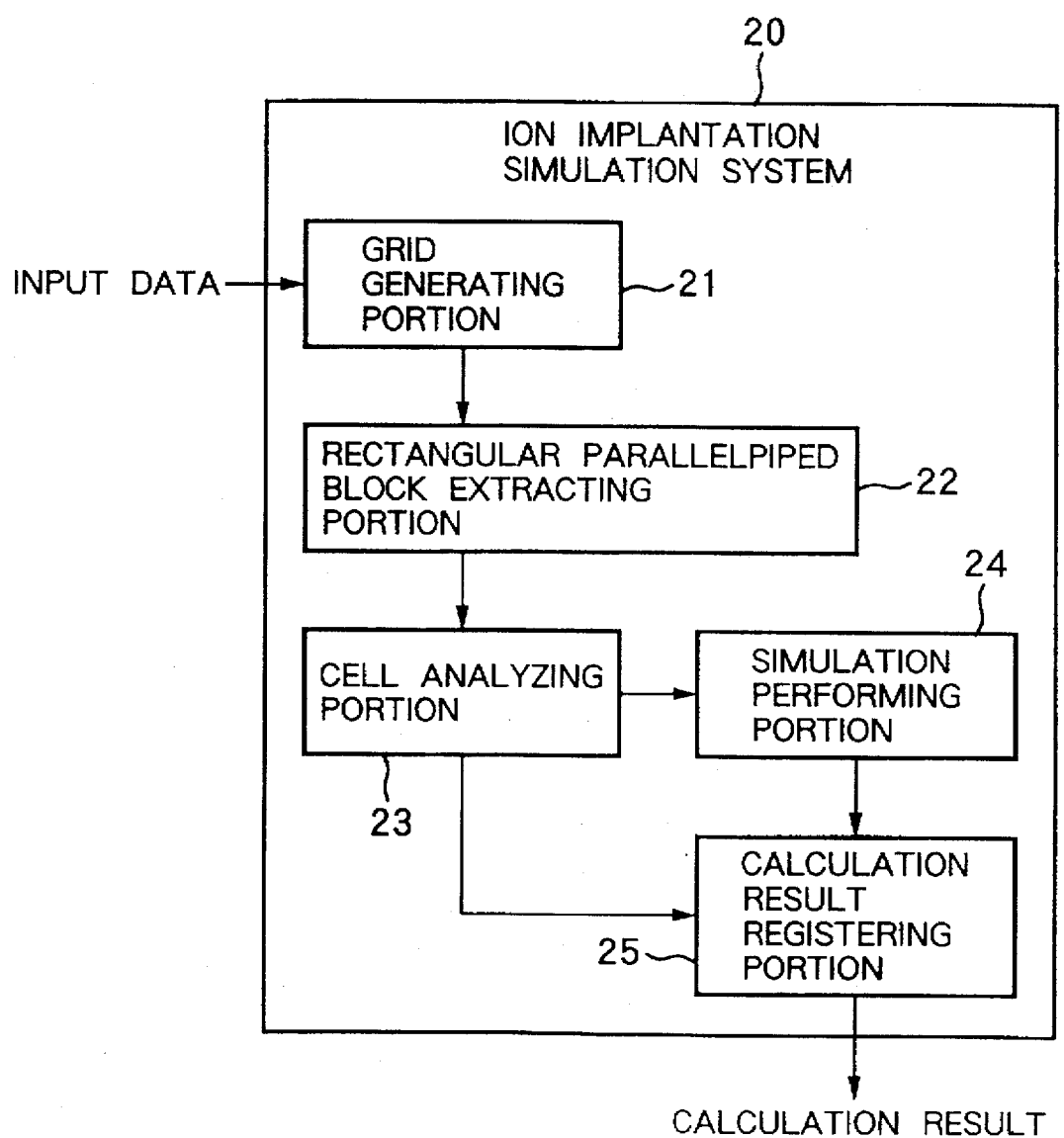
FIG. 11 is a functional block diagram showing a construction of the second embodiment of an ion implantation simulation system according to the present invention.

FIG. 11 is a functional block diagram showing a construction of the second embodiment of an ion implantation simulation system for implementing the first embodiment of an ion implantation simulating method according to the invention.

As shown, the shown embodiment of an ion implantation simulation system 20 includes a grid generating portion 21 for generating an three-dimensional grid by combining perpendicularly intersecting planes to the configuration of a semiconductor substrate as an object for simulation, an rectangular parallelopiped block extracting portion 22 for extracting rectangular parallelopiped blocks defined by the three-dimensional orthogonal grid, a cell analyzing portion 23 for extracting each three-dimensional cells defined by grid planes transverse to the longer edge direction of the extracted rectangular parallelopiped block and deriving volumes and gravity centers of respective polyhedrons presenting in the cell, a simulation executing portion 24 for performing linear ion implantation simulation with respect to the result of analysis by the cell analyzing portion 23, a calculation result registering portion 25 for registering the results of simulation performed by the simulation executing portion 24 in the original polyhedron of the cell. It should be noted that, in FIG. 11, only characteristic construction of the shown embodiment has been illustrated and other construction which are less relevant to the subject matter of the present invention has been neglected. While not disclosed, in practice, in addition to the foregoing components, an output means for displaying the sectional configuration of the semiconductor substrate as the simulation object and process of simulation, a storage means for storing various data and so forth are provided in the simulation system in per se known manner.

The grid generating portion 21 is realized by a program controlled CPU and so forth and generates the three-dimensional orthogonal grid by combining perpendicularly intersecting planes with the configuration of the semiconductor substrate as the simulation object. The three-dimensional orthogonal grid is generated in completely arbitrary fashion irrespective of the configuration of the semiconductor substrate. Accordingly, adapting to the capacity of a memory (not shown) provided in the simulation system 20, the grid is generated so as not to cause overflow.

The rectangular parallelopiped block extracting portion 22 is also realized by the program controlled CPU and so forth. The rectangular parallelopiped block extracting portion 22 extracts the rectangular parallelopiped blocks from the configuration of the semiconductor substrate, on which the three-dimensional orthogonal grid is established. The rectangular parallelopiped block extracting portion 22 extracts the vertically elongated rectangular parallelopiped blocks defined by vertically extending four grid planes, laterally elongated rectangular parallelopiped blocks defined by laterally extending four grid planes and longitudinally elongated rectangular parallelopiped blocks defined by longitudinally extending four grid planes.

The cell analyzing portion 23 is also realized by the program controlled CPU and so forth and derives the volumes and gravity centers of polyhedrons presenting in each cell with extracting cells from the rectangular parallelopiped block. Then, the cell analyzing portion 23 converts the polyhedrons into rectangular parallelopiped tree-dimensional segments having volumes equal to the volumes of the polyhedrons, and arrange the converted rectangles in the three-dimensional cell in order with respect to the gravity center positions.

The simulation executing portion 24 is realized by the program controlled CPU and so forth and performs linear ion implantation simulation with respect to each of the rectangular parallelopiped tree-dimensional segments, in which the cells containing the rectangular parallelopiped tree-dimensional segments converted and arranged in order in the cell by the cell analyzing portion 23. The linear ion implantation simulation to be performed by the simulation executing portion 24 is similar to that performed in the prior art. In concrete, the simulation is performed utilizing the foregoing equation 4.

The calculation result registering portion 25 is also realized by the program controlled CPU and so forth. The calculation result registering portion 25 registers the result of simulation to the original polyhedron in the cell with respect to each rectangular parallelopiped tree-dimensional segment. By this, in each cell, the result of simulation with respect to each polyhedron is stored.

Figure 12:
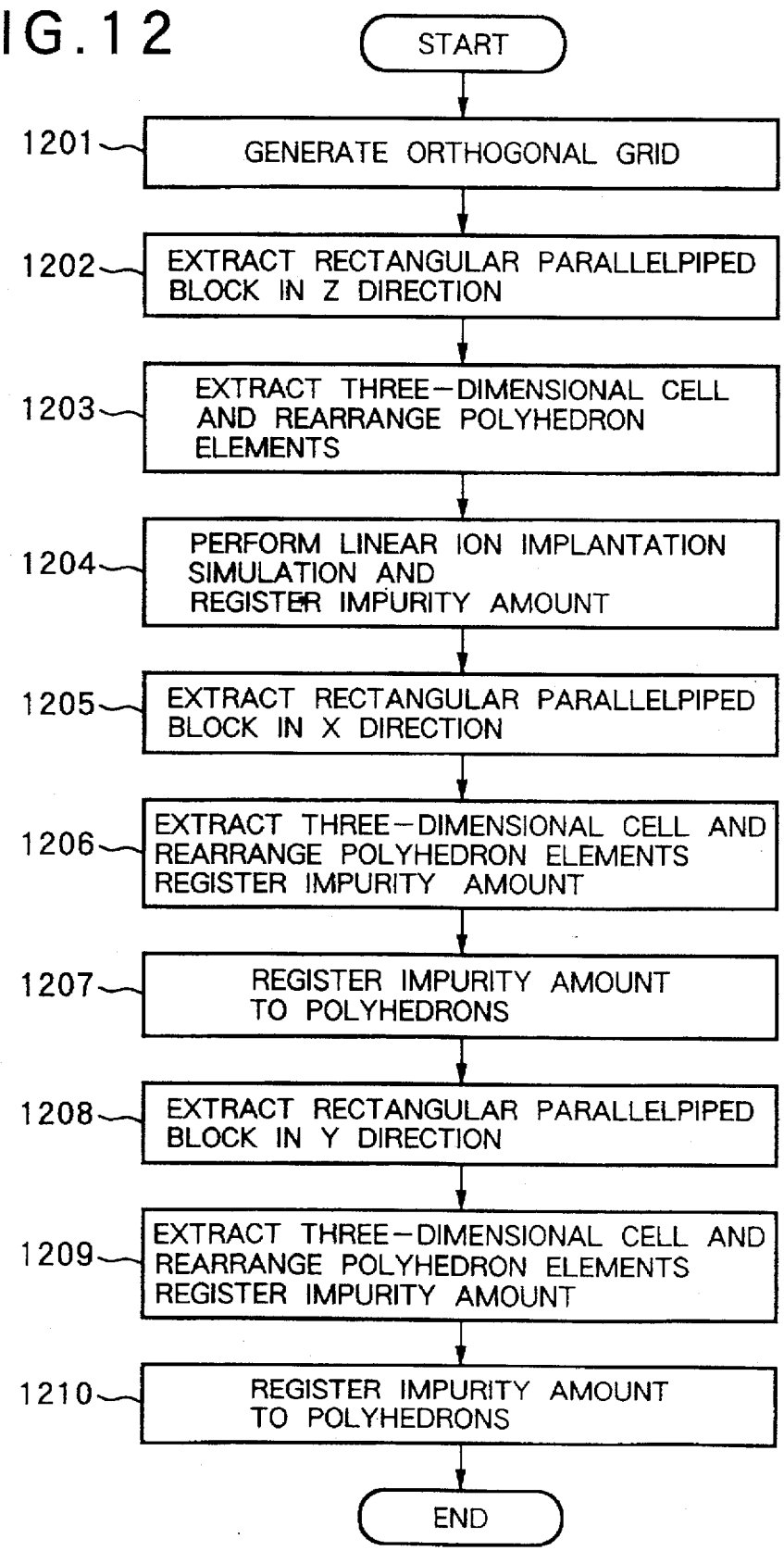
FIG. 12 is a flowchart showing operation of the second embodiment of the ion implantation simulating method according to the invention.

Next, operation in the shown embodiment of the simulation method will be discussed with reference to the flowchart in FIG. 12. It should be noted that FIG. 13 is an illustration showing a configuration of the semiconductor substrate as the simulation object, and FIGS. 14 to 20 are illustrations for explaining the process steps of ion implantation simulation performed according to the steps illustrated in FIG. 12.

Figure 13:
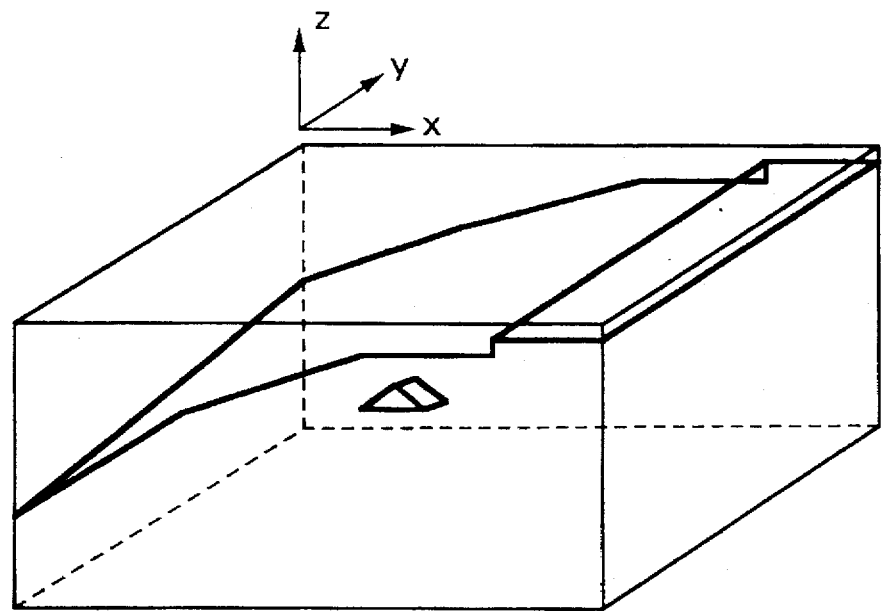
FIG. 13 is an illustration showing an intermediate step in simulation performed by the second embodiment of the ion implantation simulating method.
Figure 14:
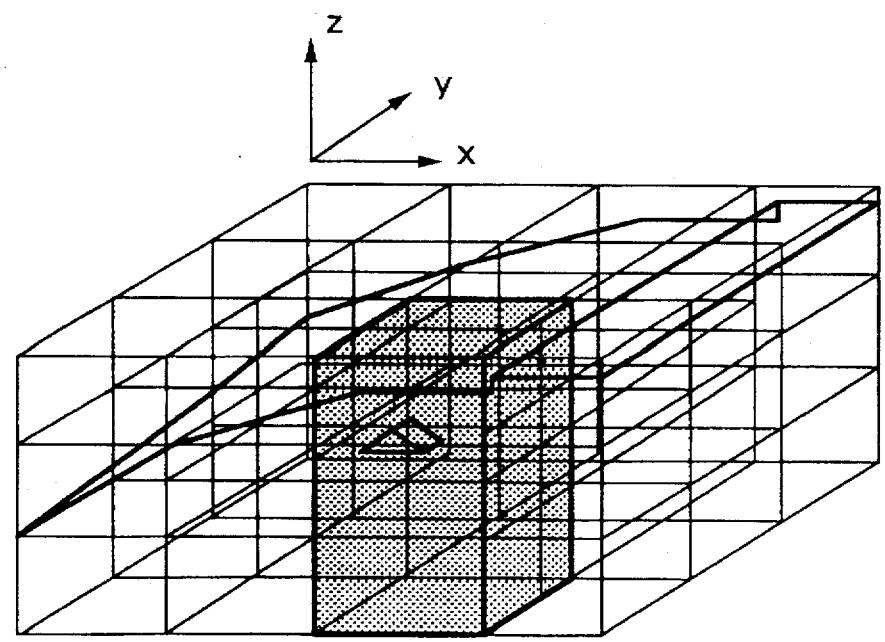
FIG. 14 is an illustration showing an intermediate step an simulation performed by the second embodiment of the ion implantation simulating method.

As shown in FIG. 13, the semiconductor substrate to be an object for process of ion implantation simulation in the shown embodiment is assumed to be constructed with a plurality of substances. On the other hand, with respect to the configuration of the semiconductor substrate, X-axis, y-axis and z-axis are set. At first, the grid generating portion 21 generates the three-dimensional orthogonal grid irrespective of the two-dimensional configuration of the substrate shown in FIG. 3, as shown in FIG. 14 (step 1201). By this, the configuration of the semiconductor substrate is divided into a plurality of small three-dimensional cells.

Figure 15:
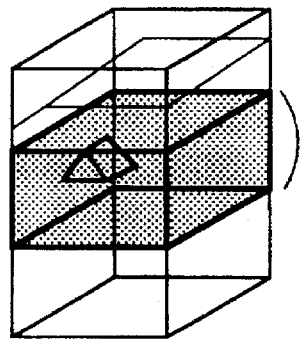
FIG. 15 is an illustration showing an intermediate step in simulation performed by the second embodiment of the ion implantation simulating method.

Next, as shown in FIG. 14, from the substrate configuration divided by the three-dimensional orthogonal grid, the rectangular parallelopiped block extracting portion 22 extracts rectangular parallelopiped blocks defined by four vertical planes perpendicular to xy plane and elongated in the direction of the z-axis in order (step 1202). As an example, the rectangular parallelopiped block extracted from the object of simulation shown in FIG. 14 is shown in FIG. 15.

Figure 16:
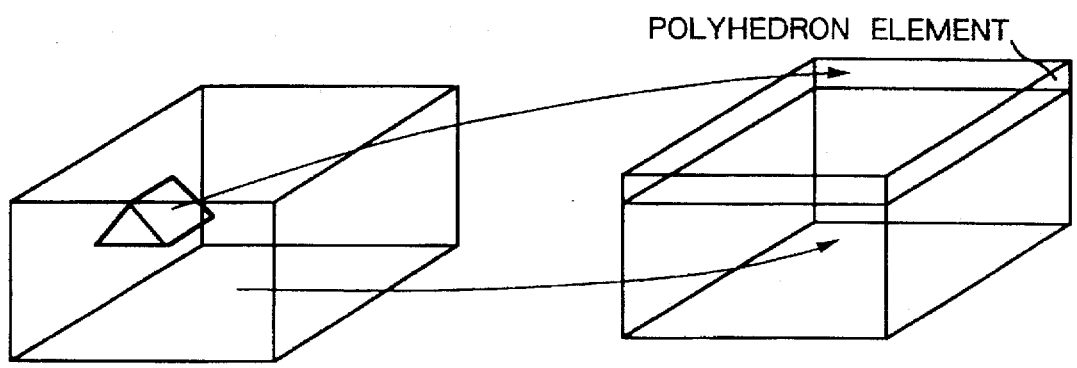
FIG. 16 is an illustration showing an intermediate step in simulation performed by the second embodiment of the ion implantation simulating method.
Figure 17:
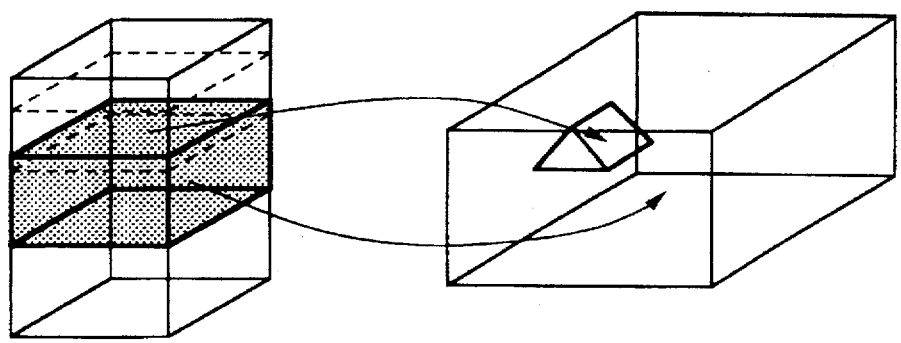
FIG. 17 is an illustration showing an intermediate step in simulation performed by the second embodiment of the ion implantation simulating method.
Figure 18:
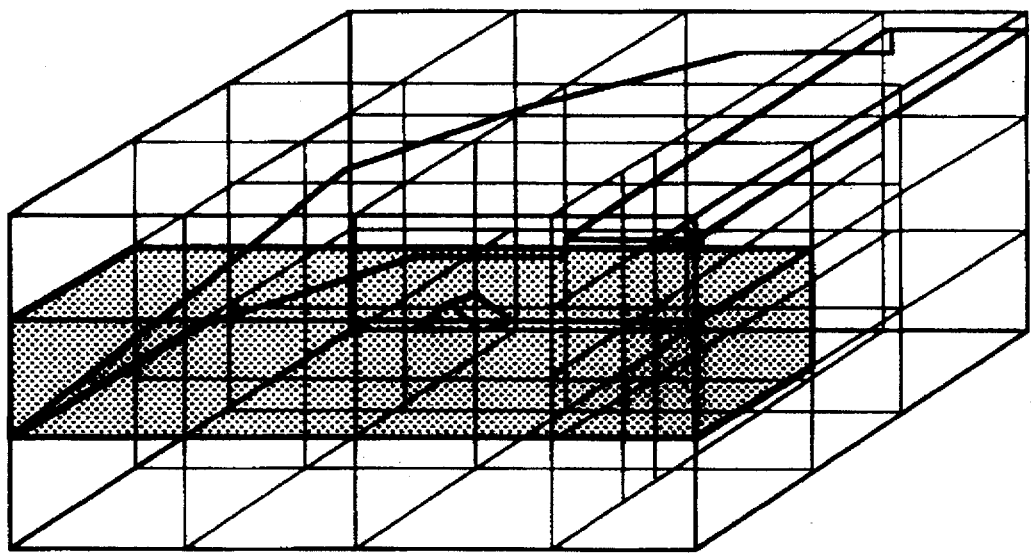
FIG. 18 is an illustration showing an intermediate step in simulation performed by the second embodiment of the ion implantation simulating method.
Figure 19:
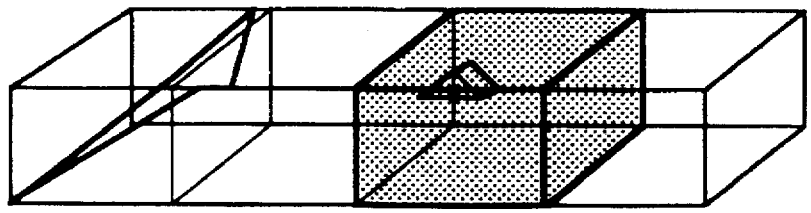
FIG. 19 is an illustration showing an intermediate step in simulation performed by the second embodiment of the ion implantation simulating method.

From each of the extracted three-dimensional block, the cell analyzing portion 23 extracts three-dimensional cells defined between respective pairs of adjacent planes parallel to the xy plane. In the rectangular parallelopiped block illustrated in FIG. 15, the three-dimensional cell extracted therefrom is illustrated in FIG. 16. The cell analyzing portion 23 divides the inside of the extracted three-dimensional cell into polyhedrons by the boundary of substances presenting in the cell and calculates volumes and gravity centers of respective polyhedrons in the cell. Then, each polyhedron is converted into rectangular parallelopiped segment elongated in the horizontal direction in the cell and having the equal volume to the original polyhedrons. In order to make the structure of the cells containing polyhedrons applicable for linear ion implantation simulation, the converted rectangular parallelopiped segments are stacked in order of the height of the gravity centers of the corresponding polyhedrons as shown in FIG. 5 (step 1203). Concerning the three-dimensional cell exemplified the rectangular parallelopiped segments are stacked as shown in FIG. 16.

Next, with respect to the rectangular parallelopiped segment converted into a multi-layer structure of a plurality of stacked rectangular parallelopiped segments in the z-axis direction by the cell analyzing portion 23, the simulation performing portion 24 performs the linear ion implantation simulation to derive amount of impurity contained in each rectangle in the cell. Subsequently, the calculation result registering portion 25 registers the calculated amount of impurity in each rectangle with correlation to the corresponding polyhedron (step 1204).

Thereafter, the rectangular parallelopiped block extracting portion 22 extracts the transverse rectangular parallelopiped blocks extending in the x-axis direction are extracted defined by respective adjacent defined by transversely extending ending four grid planes in the three-dimensional orthogonal grid (step 1205). As an example, the rectangular parallelopiped block defined by the transversely extending grid planes in FIG. 19.

Figure 20:
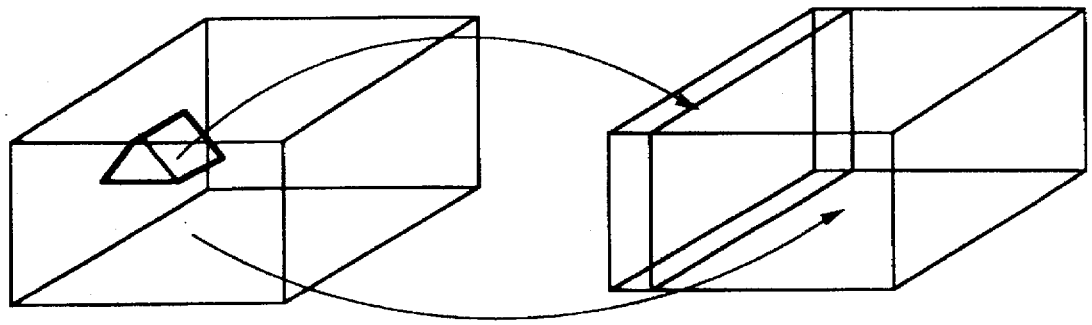
FIG. 20 is an illustration showing an intermediate step in simulation performed by the second embodiment of the ion implantation simulating method.
Figure 21:
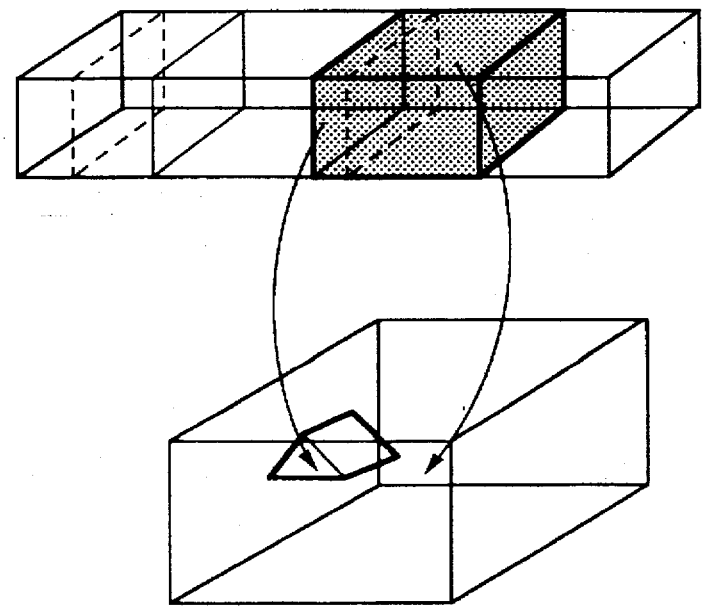
FIG. 21 is an illustration showing an intermediate step in simulation performed by the second embodiment of the ion implantation simulating method.
Figure 22:
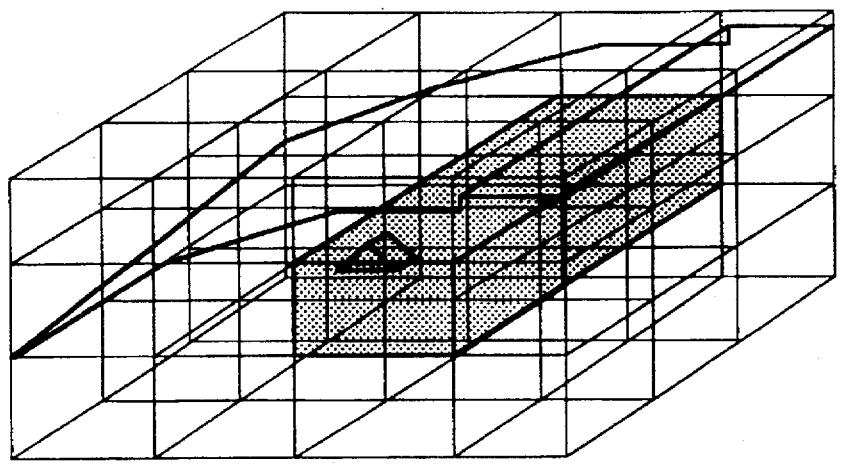
FIG. 22 is an illustration showing an intermediate step in simulation performed by the second embodiment of the ion implantation simulating method.
Figure 23:
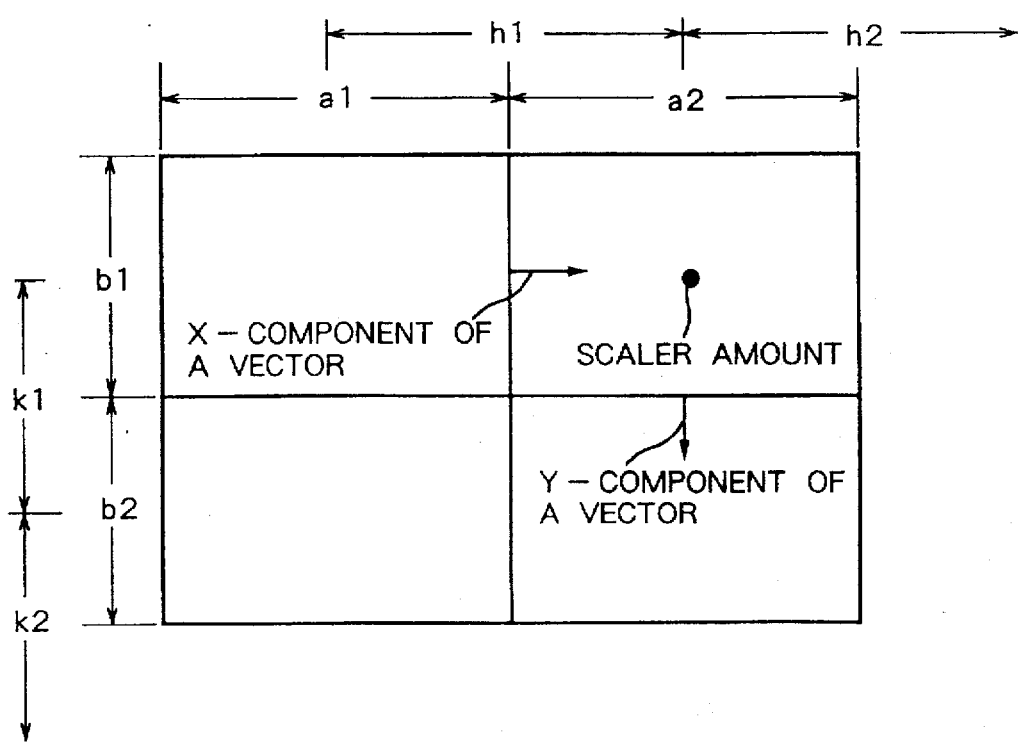
FIG. 23 is an illustration showing a difference mesh to be employed in the ion implantation method.
Figure 24:
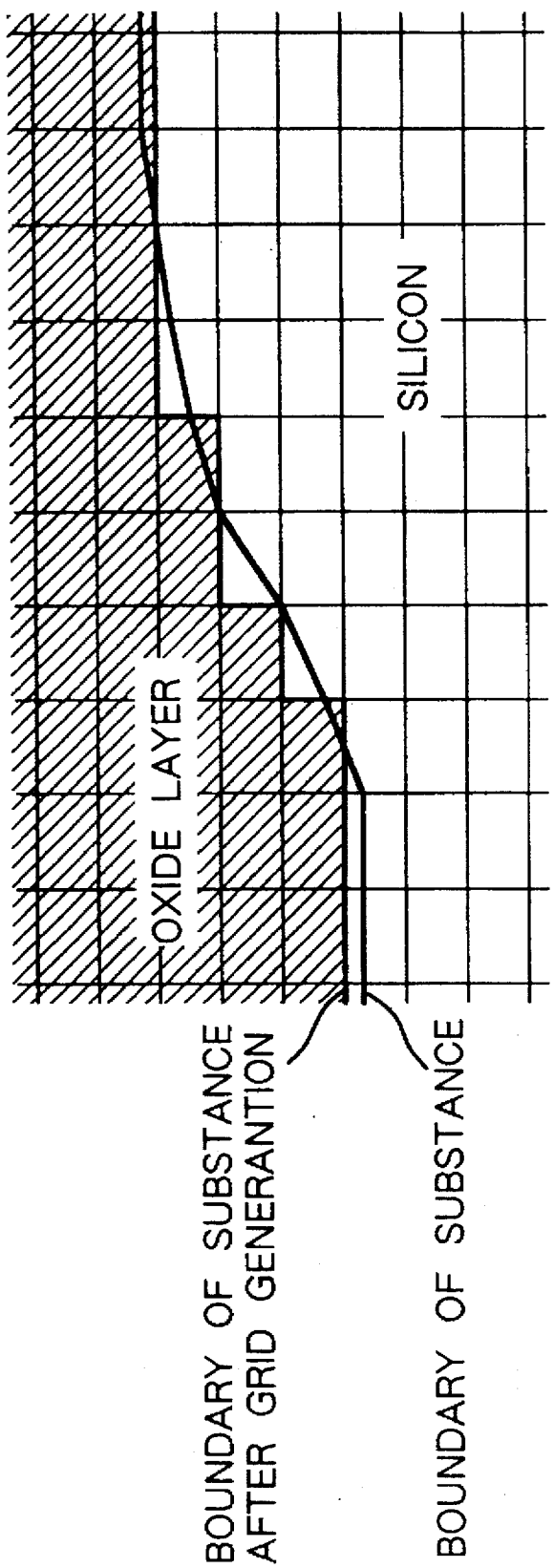
FIG. 24 is an illustration showing a condition employing the difference mesh of FIG. 23 as a grid representative of a configuration of an object of simulation.
Figure 25A:
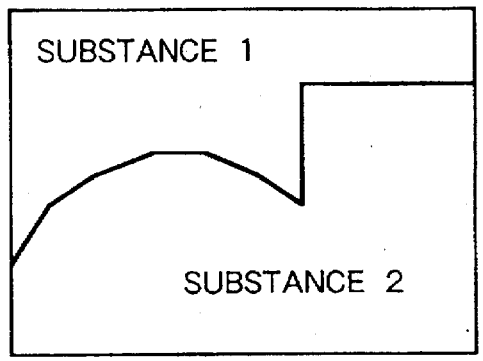
FIG. 25A is an illustration showing the simulation object expressed by line string.
Figure 25B:
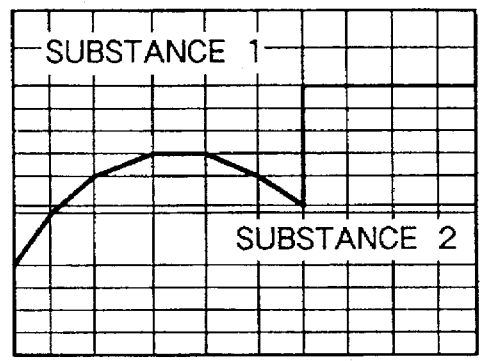
FIGS. 25B is an illustration showing a condition where an orthogonal grip is established for the configuration of FIG. 25A by the conventional ion implantation simulating method.
Figure 25C:
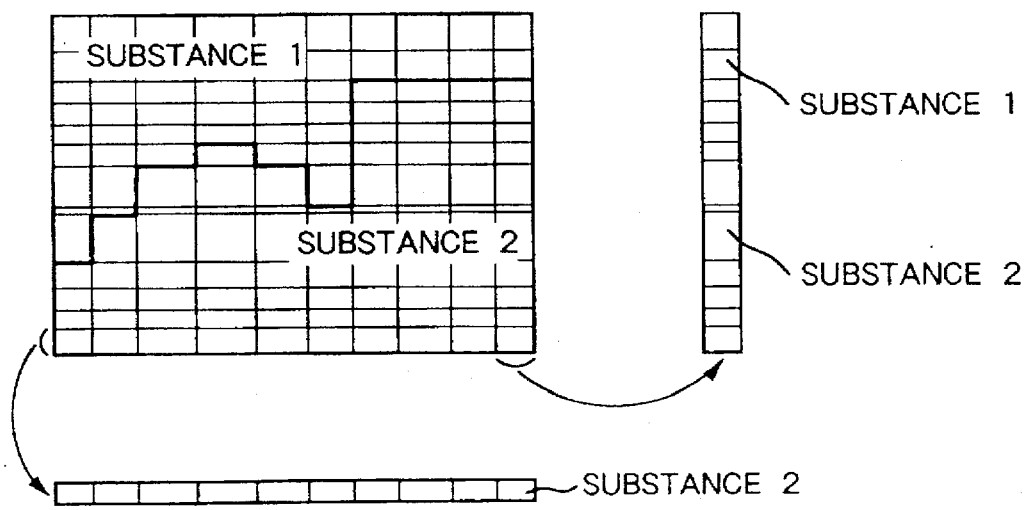
FIG. 25C is an illustration showing a process of ion implantation simulation on the basis of the configuration data of FIG. 25B.
Figure 26A:
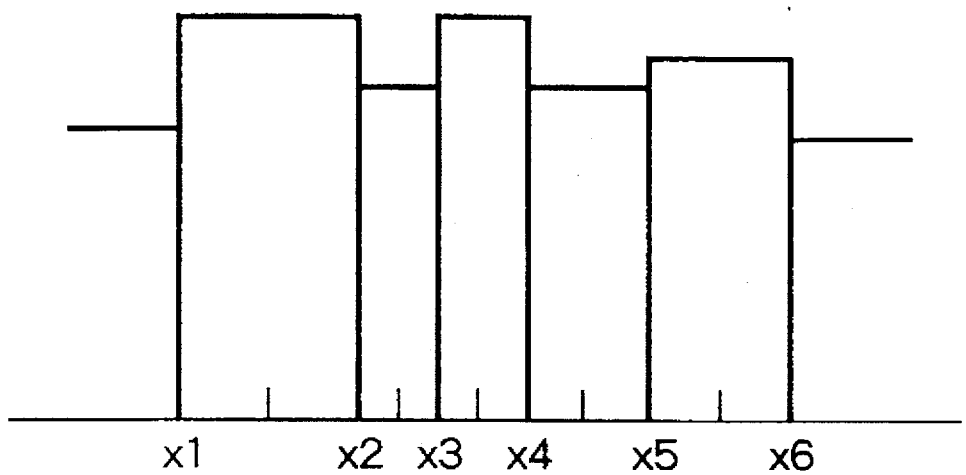
FIG. 26A is an illustration showing an example of definition of impurity dose amount.
Figure 26B:
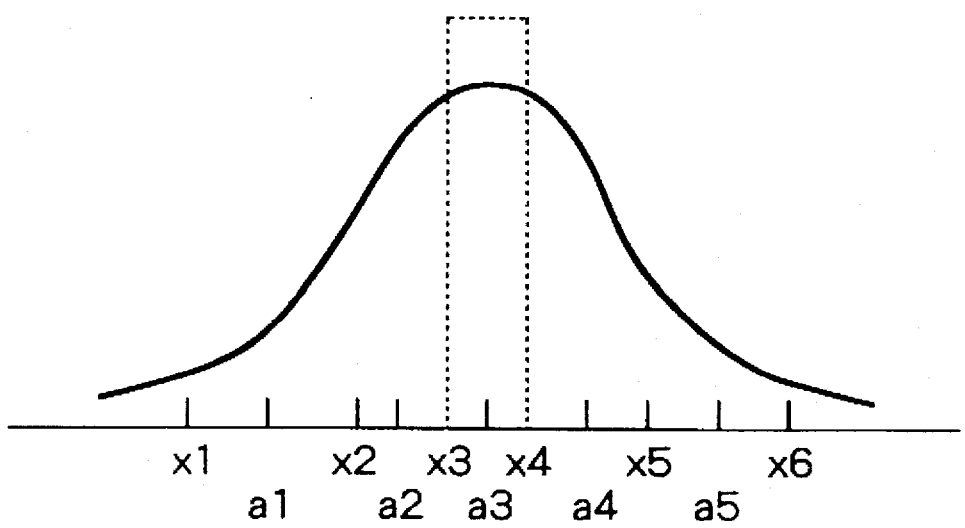
FIG. 26B is an illustration showing a result of calculation of re-distribution of impurity in the condition of FIG. 26A.
Figure 28A:
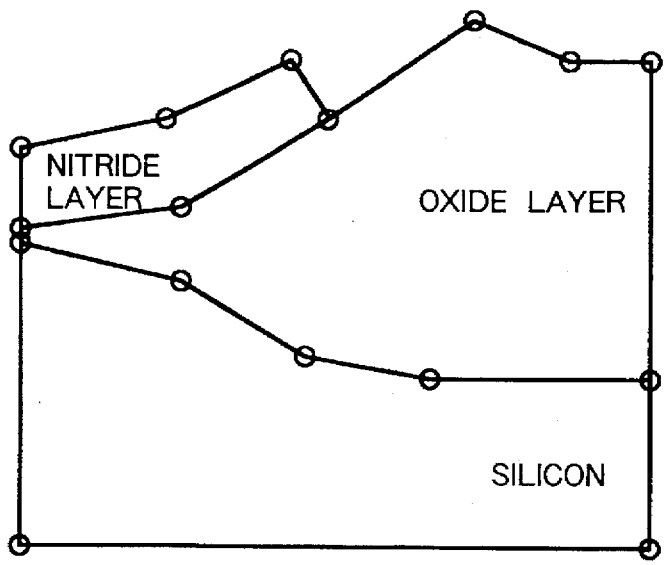
FIG. 28A is an illustration showing the configuration of the simulation object expressed by line string.
Figure 28B:
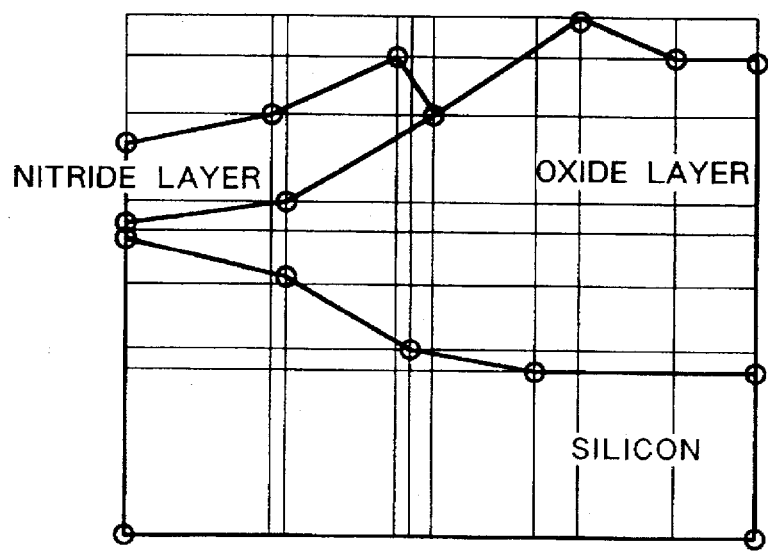
FIG. 28B is an illustration showing a condition where the orthogonal grid is established for the configuration of FIG. 28A by the conventional ion implantation method.
Figure 28C:
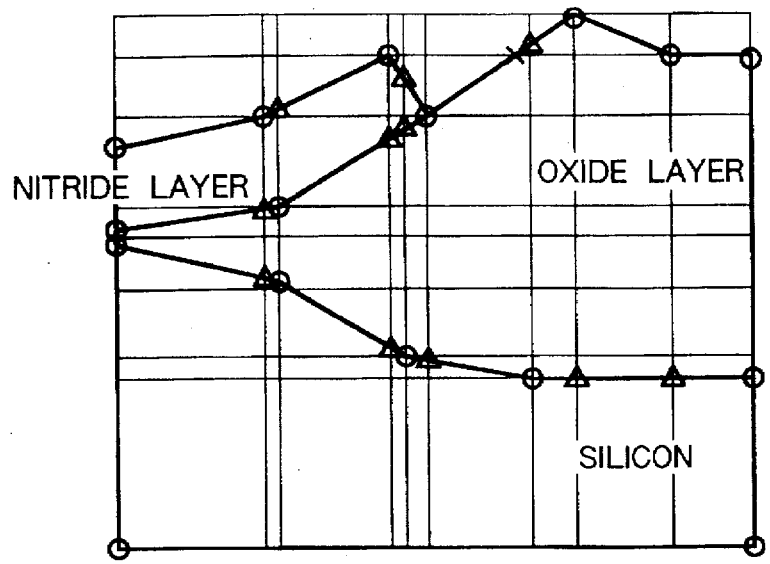
FIG. 28C is an illustration showing a condition, in which orthogonal grid is newly added for the configuration of FIG. 28A by the conventional ion implantation method.
Figure 28D:
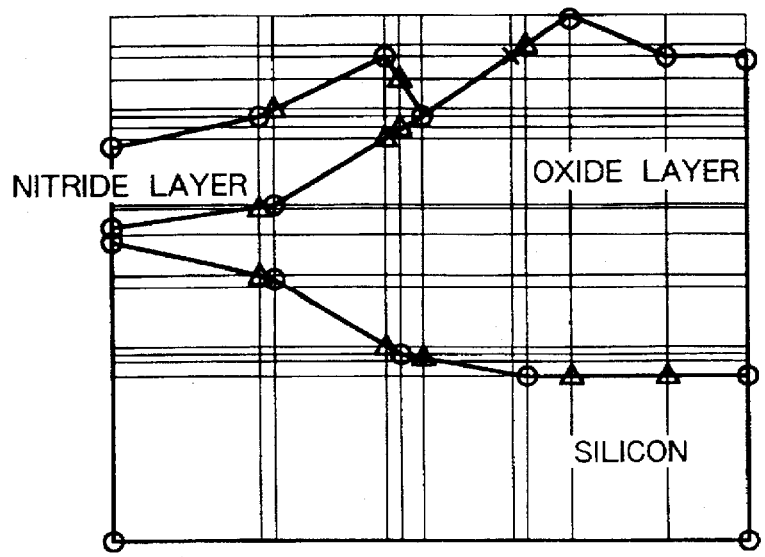
FIG. 28D is an illustration showing a condition, in which orthogonal grid is newly added for the configuration of FIG. 28C by the conventional ion implantation method.
Figure 29:
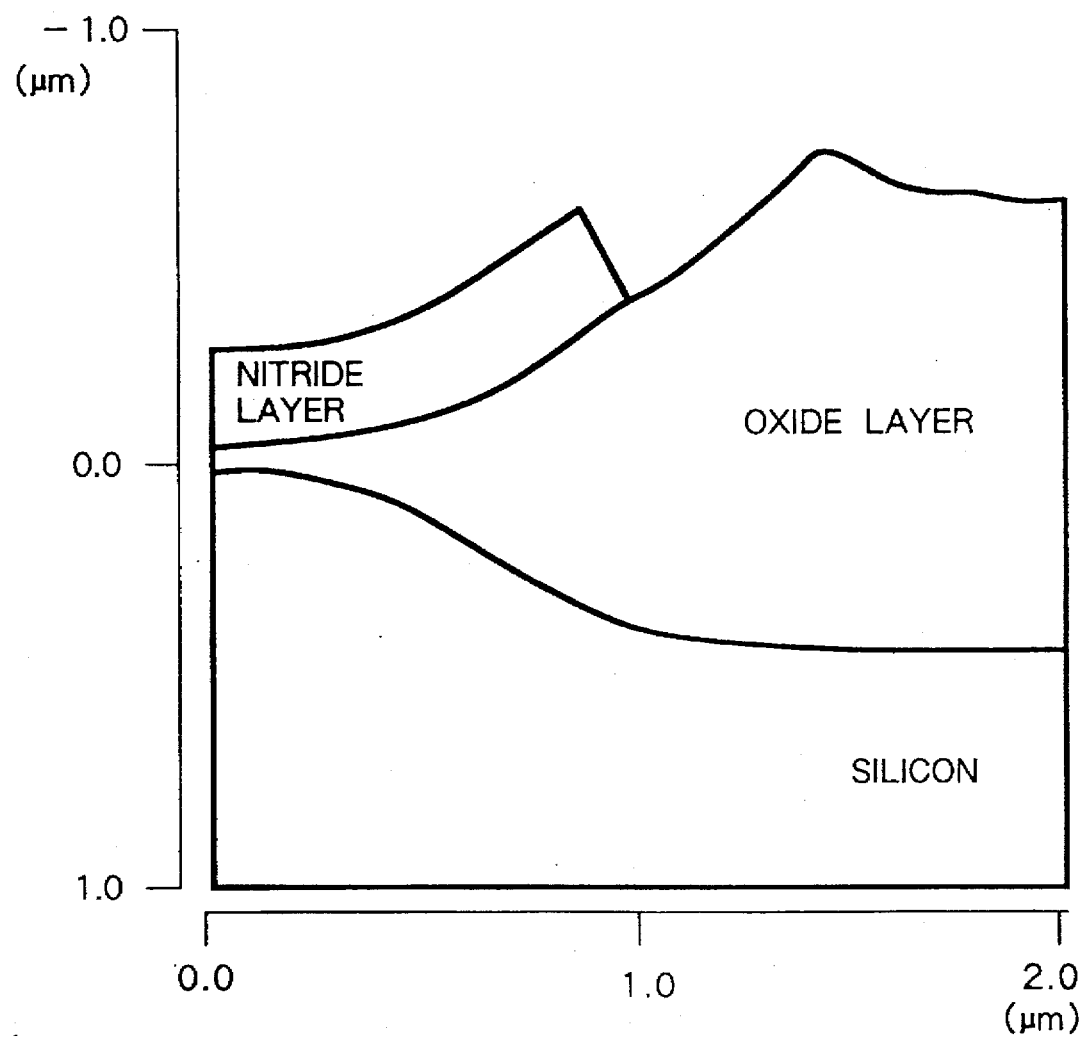
FIG. 29 is an illustration showing a configuration of the simulation object by the line string.

From the extracted laterally elongated rectangular parallelopiped block, the cell analyzing portion 23 extracts each cell defined by adjacent vertically extending grid planes. In the rectangular parallelopiped block illustrated in FIG. 19, the cell defined between the vertically extending grid planes, as illustrated in FIG. 20, for example. The cell analyzing portion 23 divides the inside of the extracted cell into polyhedrons by the boundary of substances presenting in the cell and calculates areas and gravity centers of respective polyhedrons in the cell. Then, with respect to each polyhedron, the volume and the gravity center position are derived Then, each polyhedron is converted into rectangles elongated in the vertical direction in the cell and having the equal areas to the original polyhedrons. In order to make the structure of the cells containing polyhedrons applicable for linear ion implantation simulation, the converted rectangles are stacked in order of the horizontal positions of the gravity centers of the corresponding polyhedrons as shown in FIG. 20. Then, with respect to the stacked rectangles, the impurity amount registered at the step 204 is registered in the corresponding rectangles (step 1206).

Next, the calculation result registering portion 25 performs re-distribution of impurity distribution of the horizontally extending segments converted into the linear structure with respect to each rectangular parallelopiped three-dimensional block. The impurity amount to be contained in each rectangular parallelopiped as a result of re-distribution is registered in the original polyhedron corresponding to each rectangle as shown by FIG. 20, by the calculation result registering portion 25 (step 1207).

Here, by extending the prior art, in the cell defined by the transversely extending cells, the substance has the largest polyhedron having the biggest area. Therefore, it may be easily thought of that the conversion is performed with regarding that the overall cell in question is formed of the substance. However, in the shown embodiment, by converting respective polyhedrons into rectangles to perform simulation, even substance having small area is not ignored. Therefore, higher accuracy in simulation can be achieved.

Next, the block extracting portion 22 extracts the polyhedron defined by the transversely extending grip planes by transversely extending four grid planes in parallel n the y-direction (step 1208).

From the three-dimensional block elongated in the transverse direction, the transversely elongated rectangular parallelopiped block, the cell analyzing portion 23 extracts each cell defined by adjacent mutually parallel grid plan in parallel to the three-dimensional cells. Then, the cell analyzing portion 23 divides the three-dimensional cell into a plurality of polyhedrons by boundaries of the substances presenting within the three-dimensional cells, and calculates volume and the gravity center positions. Each polyhedron is then converted into the rectangular parallelopiped segment extending in the x-axis direction and z-axis direction within the three-dimensional cell. The rectangular parallelopiped segment after conversion are arranged depending upon the gravity center position of corresponding polyhedron. Also, the impurity amount registered to the polyhedron at the step 1204 is registered in respective rectangular parallelopiped block corresponding to the polyhedron (step 1209).

Then, the calculation result register portion 25 performs re-distribution of the impurity registered, in y direction. After completion of re-distribution the impurity amount to be contained in each of the rectangular parallelopiped segment is registered in the polyhedron corresponding to the rectangular parallelopiped segment in question (step 1210).

It should be noted that at the steps 1206 and 1209, it is clear to use the volume of the polyhedron calculated at the step 1203 instead of calculating the volume of respective polyhedrons. In this way, redundant calculation of the volume of the polyhedron can be avoided to contribute for improvement of throughput.

As set forth above, when ion implantation simulation is performed by the present invention, even when the configuration of the semiconductor substrate as the simulation object becomes complicate, overflow can be certainly avoided since grid can be generated irrespective of the configuration of the semiconductor substrate.

For instance, in case of two-dimensional simulation, and when 10,000 storage cell is provided in the memory array for storing the impurity concentration, grid may be established not to exceed 10,000, such as 100×100. Therefore, simulation can be certainly performed without causing overflow. On the other hand, in case of three-dimensional simulation and when 1,000,000 storage capacity is provided for storing the impurity concentration, grid may be established not to exceed 10,000, such as 100×100×100. Therefore, simulation can be certainly performed without causing overflow.

Although the invention has been illustrated and described with respect to exemplary embodiment thereof, it should be understood by those skilled in the art that the foregoing and various other changes, omissions and additions may be made therein and thereto, without departing from the spirit and scope of the present invention. Therefore, the present invention should not be understood as limited to the specific embodiment set out above but to include all possible embodiments which can be embodies within a scope encompassed and equivalents thereof with respect to the feature set out in the appended claims.

What is claimed is:

1. An ion implantation simulation system, comprising:

grid generating means for generating an orthogonal grid with respect to a two-dimensional configuration of a simulation object;

elongated segment extracting means for extracting elongated segments defined by two grid lines in saint orthogonal grid;

cell analyzing means for extracting cells defined by adjacent grid lines perpendicular to the longer edge of said elongated segment, in the extracted elongated segments, and linearly rearranging polygon elements present in said cell along the longer edge direction;

simulation means for performing linear ion implantation simulation with respect to the cell, in which the polygon elements are linearly rearranged; and calculation result registering means for registering an impurity concentration obtained as a result of simulation for each polygon element and registering the impurity concentration in each polygon element, wherein said cell analyzing means calculates areas and gravity center positions of polygon elements in the extracted cell and converts respective polygon elements into rectangular elements having the same areas to corresponding polygon elements, and rearranges the rectangular elements depending upon calculated gravity center position along the longer edge direction.

2. An ion implantation simulation system, comprising:

grid generating means for generating an orthogonal grid with respect to a two-dimensional configuration of a simulation object;

elongated segment extracting means for extracting elongated segments defined by two grid lines in said orthogonal grid;

cell analyzing means for extracting cells defined by adjacent grid lines perpendicular to the longer edge of said elongated segment, in the extracted elongated segments, and linearly rearranging polygon elements present in said cell along a longer edge direction;

simulation means for performing linear ion implantation simulation with respect to the cell, in which the polygon elements are linearly rearranged; and calculation result registering means for registering an impurity concentration obtained as a result of simulation for each polygon element and registering the impurity concentration in each polygon element, wherein said elongated segment extracting means extracts all of elongated segments in orthogonal two directions formed by said orthogonal grid, and wherein said cell analyzing means rearranges said polygon elements with respect to each cell along said longer edge direction with respect to the elongated segment extracted in two directions, and wherein said cell analyzing means calculates areas and gravity center positions of polygon elements in the extracted cell and converts respective polygon elements into rectangular elements having the same areas to corresponding polygon elements, and rearranges the rectangular elements depending upon calculated gravity center position along the longer edge direction.

3. An ion implantation simulation system as set forth in claim 2, wherein said cell analyzing means calculates the areas and gravity center positions of the polygon elements in one cell included in mutually perpendicularly extending two elongated segments with respect to one of said two elongated segments, and calculates only gravity center positions upon rearranging said polygon elements within the cell with respect to the other elongated segment with using areas calculated upon rearranging the polygon segments with respect to said one of the elongated segment.

4. An ion implantation simulation system, comprising:

grid generating means for generating an arbitrary orthogonal three-dimensional grid with respect to a three-dimensional configuration of a simulation object;

rectangular parallelopiped block extracting means for extracting rectangular parallelopiped blocks defined by two orthogonally arranged sets of mutually parallel two planes;

cell analyzing means for extracting three-dimensional cells defined by adjacent grid planes perpendicular to a longer edge of said elongated segment, in the extracted rectangular parallelopiped blocks, and linearly rearranging polyhedral elements presenting in said three-dimensional cell along a longer edge direction;

simulation means for performing linear ion implantation simulation with respect to the three-dimensional cell, in which the polyhedron elements are linearly rearranged; and calculation result registering means for registering an impurity concentration obtained as a result of simulation for each polyhedron element and registering the impurity concentration in each polyhedron element, wherein said cell analyzing means calculates volumes and gravity center positions of polyhedron elements in the extracted three-dimensional cell and converts respective polyhedron elements into rectangular parallelopiped elements having the same volumes as corresponding polyhedron elements, and rearranges the rectangular parallelopiped elements depending upon calculated gravity center position along the longer edge direction.

5. An ion implantation simulation system, comprising:

grid generating means for generating an arbitrary orthogonal three-dimensional grid with respect to a three-dimensional configuration of a simulation object;

rectangular parallelopiped block extracting means for extracting rectangular parallelopiped blocks defined by two orthogonally arranged sets of mutually parallel two planes;

cell analyzing means for extracting three-dimensional cells defined by adjacent grid planes perpendicular to a longer edge of said elongated segment, in the extracted rectangular parallelopiped blocks, and linearly rearranging polyhedral elements presenting in said three-dimensional cell along a longer edge direction;

simulation means for performing linear ion implantation simulation with respect to the three-dimensional cell, in which the polyhedron elements are linearly rearranged; and calculation result registering means for registering an impurity concentration obtained as a result of simulation for each polyhedron element and registering the impurity concentration in each polyhedron element, wherein said rectangular parallelopiped block extracting means extracts all of rectangular parallelopiped block in the three-dimensional grids, and wherein said cell analyzing means rearranges said polyhedron elements with respect to each cell along the longer edge direction with respect to the rectangular parallelopiped blocks extracted in three directions, and wherein said cell analyzing means calculates volumes and gravity center positions of polyhedron elements in the extracted three-dimensional cell and converts respective polyhedron elements into rectangular parallelopiped elements having the same volumes as corresponding polyhedron elements and having uniform length in the width direction, and rearranges the rectangular parallelopiped elements depending upon calculated gravity center position along the longer edge direction.

6. An ion implantation simulation system as set forth in claim 5, wherein said cell analyzing means calculates the volumes and gravity center positions of the polyhedron elements in one three-dimensional cell included in mutually perpendicularly extending three rectangular parallelopiped blocks with respect to one of said three rectangular parallelopiped blocks, and calculates only gravity center positions upon rearranging said polyhedron elements within the three-dimensional cell with respect to the other rectangular parallelopiped blocks using areas calculated upon rearranging the polyhedron segments with respect to said one of the rectangular parallelopiped blocks.

7. An ion implantation simulation method comprising steps of:

generating an orthogonal grid with respect to a two-dimensional configuration of a simulation object;

extracting elongated segments defined by two grid lines in said orthogonal grid;

extracting cells defined by adjacent grid lines perpendicular to a longer edge of said elongated segment, in the extracted elongated segments, and linearly rearranging polygon elements present in said cell along a longer edge direction;

performing linear ion implantation simulation with respect to the cell, in which the polygon elements are linearly rearranged; and registering an impurity concentration obtained as a result of simulation for each polygon element and registering the impurity concentration in each polygon element, wherein said cell analyzing step comprises:

calculating areas and gravity center positions of polygon elements in the extracted cell;

converting respective polygon elements into rectangular elements having the same areas to corresponding polygon elements; and rearranging the rectangular elements depending upon calculated gravity center position along the longer edge direction.

8. An ion implantation simulation method comprising steps of:

generating an orthogonal grid with respect to a two-dimensional configuration of a simulation object;

extracting elongated segments defined by two grid lines in said orthogonal grid and extending in a first direction in said orthogonal grid;

extracting cells defined by adjacent grid lines perpendicular to a longer edge of said elongated segment in the extracted elongated segments;

linearly rearranging polygon elements presenting in said cell along a longer edge direction corresponding to the elongated segment defined by grid lines extending in said first direction;

performing linear ion implantation simulation with respect to the cell in which the polygon elements are linearly rearranged;

registering an impurity concentration obtained as a result of simulation for each polygon element and registering the impurity concentration in each polygon element;

extracting elongated segments defined by two grid lines in said orthogonal grid and extending in a second direction in said orthogonal grid;

extracting cells defined by adjacent grid lines perpendicular to the longer edge of said elongated segment in the extracted elongated segment;

linearly rearranging polygon elements present in said cell along the longer edge direction corresponding to the elongated segment defined by grid lines extending in said second direction; and registering an impurity concentration obtained as a result of simulation for each polygon element and registering the impurity concentration in each polygon element, wherein said step of linearly rearranging the polygon elements within said cell comprises:

calculating areas and gravity center positions of polygon elements in the extracted cell; and rearranging the polygon elements along the longer edge of the elongated segment depending upon the calculated gravity center positions.

9. An ion implantation simulation method, comprising steps of:

generating an orthogonal grid with respect to a two-dimensional configuration of a simulation object;

extracting elongated segments defined by two grid lines in said orthogonal grid and extending in a first direction in said orthogonal grid;

extracting cells defined by adjacent grid lines perpendicular to a longer edge of said elongated segment in the extracted elongated segments;

linearly rearranging polygon elements presenting in said cell along the longer edge direction corresponding to the elongated segment defined by grid lines extending in said first direction;

performing linear ion implantation simulation with respect to the cell in which the polygon elements are linearly rearranged;

registering an impurity concentration obtained as a result of simulation for each polygon element and registering the impurity concentration in each polygon element;

extracting elongated segments defined by two grid lines in said orthogonal grid and extending in a second direction in said orthogonal grid;

extracting cells defined by adjacent grid lines perpendicular to the longer edge of said elongated segment in the extracted elongated segments;

linearly rearranging polygon elements present in said cell along the longer edge direction corresponding to the elongated segment defined by grid lines extending in said second direction; and registering an impurity concentration obtained as a result of simulation for each polygon element and registering the impurity concentration in each polygon element, wherein the step of linearly rearranging the polygon elements within said cell corresponding to the elongated segment defined by grid lines extending in said first direction comprises the steps:

calculating areas and gravity center positions of the polygon elements within the extracted cell;

converting said polygon elements into a rectangular elements having same areas to the corresponding polygon elements; and rearranging said rectangular elements along the longer edge direction of said elongated segment depending upon the gravity center positions, and the step of rearranging the polygon elements within said cell corresponding to the elongated segment defined by grid lines extending in said second direction comprises:

calculating the gravity center positions of the polygon elements within the extracted cell;

converting said polygon elements into a rectangular elements having the same areas to areas calculated in the step of rearranging the polygon elements in the cell corresponding to the elongated segment defined by the grid line extending in said one direction, and having uniform length in the width direction; and rearranging said rectangular elements along the longer edge direction of said elongated segment depending upon the gravity center positions.

10. An ion implantation simulation method, comprising the steps of:

generating an arbitrary orthogonal three-dimensional grid with respect to a three-dimensional configuration of a simulation object;

extracting rectangular parallelopiped blocks defined by two orthogonally arranged sets of mutually parallel two planes;

extracting three-dimensional cells defined by adjacent grid planes perpendicular to the longer edge of said elongated segment in the extracted rectangular parallelopiped blocks, and linearly rearranging polyhedral elements presenting in said three-dimensional cell along a longer edge direction;

performing linear ion implantation simulation with respect to the three-dimensional cell, in which the polyhedron elements are linearly rearranged; and registering an impurity concentration obtained as a result of simulation for each polyhedron element and registering the impurity concentration in each polyhedron element, wherein said step of linearly rearranging the polyhedron elements within said cell comprises the steps of:

calculating volumes and gravity center positions of the polyhedron elements within the extracted three-dimensional cell;

converting said polyhedron elements into rectangular parallelopiped elements having equal volume to the corresponding polyhedron elements and having a plane equal to a plane perpendicular to the longitudinal direction of said rectangular parallelopiped block; and rearranging said rectangular parallelopiped elements along the longitudinal direction of the rectangular parallelopiped block depending upon the gravity center positions.

11. An ion implantation simulation method, comprising steps of:

generating an arbitrary orthogonal three-dimensional grid with respect to a three-dimensional configuration of a simulation object;

extracting rectangular parallelopiped blocks define by two orthogonally arranged sets of mutually parallel two planes, in which four planes extend in a first direction;

extracting three-dimensional cells defined by adjacent grid planes perpendicular to a longer edge of said elongated segment, in the extracted rectangular parallelopiped blocks, and linearly rearranging polyhedral elements presenting in said three-dimensional cell along the longer edge direction;

performing linear ion implantation simulation with respect to the three-dimensional cell, in which the polyhedron elements are linearly rearrange;

registering an impurity concentration obtained as a result of simulation for each polyhedron element and registering the impurity concentration in each polyhedron element;

extracting rectangular parallelopiped blocks defined by two orthogonally arranged sets of mutually parallel two planes, in which four planes extending in a second direction;

extracting three-dimensional cells defined by adjacent grid planes perpendicular to the longer edge of said elongated segment, in the extracted rectangular parallelopiped blocks, and linearly rearranging polyhedral elements presenting in said three-dimensional cell along a longer edge direction;

registering an impurity concentration obtained as a result of simulation for each polyhedron element and registering the impurity concentration in each polyhedron element derived by performing linear ion implantation simulation with respect to the three-dimensional cell, in which the polyhedron elements are linearly rearranged with respect to said rectangular parallelopiped block defined by said four planes extending in said one direction;

extracting rectangular parallelopiped blocks defined by two orthogonally arranged sets of mutually parallel two planes, in which four planes extending in a third direction perpendicular to said first direction and to said second direction;

extracting three-dimensional cells defined by adjacent grid planes perpendicular to the longer edge of said elongated segment, in the extracted rectangular parallelopiped blocks, and linearly rearranging polyhedral elements presenting in said three-dimensional cell along the longer edge direction;

registering an impurity concentration obtained as a result of simulation for each polyhedron element and registering the impurity concentration in each polyhedron element derived by performing linear ion implantation simulation with respect to the three-dimensional cell, wherein the polyhedron elements are linearly rearranged with respect to said rectangular parallelopiped block defined by said four planes extending in said first direction, wherein said step of rearranging the polyhedron elements within said cell comprises:

calculating volumes and gravity center positions of said polyhedron elements in the extracted three-dimensional cell;

converting said polyhedron elements into rectangular parallelopiped elements having equal volume to a corresponding polyhedron elements and having a plane equal to the plane perpendicular to the longitudinal direction of said rectangular parallelopiped block; and rearranging said rectangular parallelopiped elements along the longitudinal direction of the rectangular parallelopiped block depending upon the gravity center positions.

12. An ion implantation simulation method, comprising steps of:

generating an arbitrary orthogonal three-dimensional grid with respect to a three-dimensional configuration of a simulation object;

extracting rectangular parallelopiped blocks defined by two orthogonally arranged sets of mutually parallel two planes, in which four planes extend in a first direction;

extracting three-dimensional cells defined by adjacent grid planes perpendicular to the longer edge of said elongated segment, in the extracted rectangular parallelopiped blocks, and linearly rearranging polyhedral elements presenting in said three-dimensional cell along the longer edge direction;

performing linear ion implantation simulation with respect to the three-dimensional cell, in which the polyhedron elements are linearly rearranged;

registering an impurity concentration obtained as a result of simulation for each polyhedron element and registering the impurity concentration in each polyhedron element;

extracting rectangular parallelopiped blocks defined by two orthogonally arranged sets of mutually parallel two planes, in which four planes extending in a second direction;

extracting three-dimensional cells defined by adjacent grid planes perpendicular to the longer edge of said elongated segment, in the extracted rectangular parallelopiped blocks, and linearly rearranging polyhedral elements presenting in said three-dimensional cell along the longer edge direction;

registering an impurity concentration obtained as a result of simulation for each polyhedron element and registering the impurity concentration in each polyhedron element derived by performing linear ion implantation simulation with respect to the three-dimensional cell, in which the polyhedron elements are linearly rearranged with respect to said rectangular parallelopiped block defined by said four planes extending in said one direction;

extracting rectangular parallelopiped blocks defined by two orthogonally arranged sets of mutually parallel two planes, in which four planes extending in a third direction perpendicular to said first direction and to said second direction;

extracting three-dimensional cells defined by adjacent grid planes perpendicular to the longer edge of said elongated segment, in the extracted rectangular parallelopiped blocks, and linearly rearranging polyhedral elements presenting in said three-dimensional cell along the longer edge direction;

registering an impurity concentration obtained as a result of simulation for each polyhedron element and registering the impurity concentration in each polyhedron element derived by performing linear ion implantation simulation with respect to the three-dimensional cell, wherein the polyhedron elements are linearly rearranged with respect to said rectangular parallelopiped block defined by said four planes extending in said first direction, wherein the step of rearranging polyhedron elements within said three-dimensional cell corresponding to the rectangular parallelopiped block defined by four grid planes extending in the first direction comprises:

calculating volumes and gravity center positions of said polyhedron elements in the extracted three-dimensional cell;

converting said polyhedron elements into rectangular parallelopiped elements having the equal volume to the corresponding polyhedron elements and having a plane equal to a plane perpendicular to the longitudinal direction of said rectangular parallelopiped block; and rearranging said rectangular parallelopiped elements along the longitudinal direction of the rectangular parallelopiped block depending upon the gravity center positions, and the step of rearranging polyhedron elements within said three-dimensional cell corresponding to the rectangular parallelopiped block defined by four grid planes extending in the second direction perpendicular to said first direction comprises:

calculating gravity center positions of said polyhedron elements in the extracted three-dimensional cell;

converting said polyhedron elements into rectangular parallelopiped elements having equal volume to the volume of the polyhedrons calculated in the step of rearranging the polyhedrons within the three-dimensional cell corresponding to the rectangular parallelopiped block defined by four grid planes extending in said first direction, and having a plane equal to the plane perpendicular to the longitudinal direction of said rectangular parallelopiped block; and rearranging said rectangular parallelopiped elements along the longitudinal direction of the rectangular parallelopiped block depending upon the gravity center positions.

* * * * *